(12) United States Patent
Brask et al.

(10) Patent No.: US 7,531,437 B2
(45) Date of Patent: May 12, 2009

(54) METHOD OF FORMING METAL GATE ELECTRODES USING SACRIFICIAL GATE ELECTRODE MATERIAL AND SACRIFICIAL GATE DIELECTRIC MATERIAL

(75) Inventors: Justin K. Brask, Portland, OR (US); Brian S. Doyle, Portland, OR (US); Jack Kavalieros, Portland, OR (US); Mark Doczy, Beaverton, OR (US); Uday Shah, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/360,269

(22) Filed: Feb. 22, 2006

(65) Prior Publication Data

US 2006/0138552 A1 Jun. 29, 2006

Related U.S. Application Data

(62) Division of application No. 10/956,279, filed on Sep. 30, 2004, now Pat. No. 7,361,958.

(51) Int. Cl.
*H01L 21/3205* (2006.01)
(52) U.S. Cl. .................. 438/585; 438/183; 438/199; 438/926; 438/974; 257/E21.444; 257/E21.453
(58) Field of Classification Search ............... 438/199, 438/149, 183, 585, 926, 974; 257/E21.444, 257/E21.453
See application file for complete search history.

(56) References Cited

U.S. PATENT DOCUMENTS 5,124,777 A 6/1992 Lee
5,338,959 A 8/1994 Kim et al.

(Continued)

FOREIGN PATENT DOCUMENTS

EP 0 623 963 A1 11/1994

(Continued)

OTHER PUBLICATIONS

International Search Report PCT/US2005/033439, mailed Jan. 31, 2006 (7 pgs.).
International Search Report PCT/US2005/035380, mailed Feb. 13, 2006 (14 pgs.).

(Continued)

*Primary Examiner*—Phat X Cao
*Assistant Examiner*—Abul Kalam
(74) *Attorney, Agent, or Firm*—Blakely, Sokoloff, Taylor & Zafman LLP

(57) ABSTRACT

A semiconductor device comprising a semiconductor body having a top surface and a first and second laterally opposite sidewalls as formed on an insulating substrate is claimed. A gate dielectric is formed on the top surface of the semiconductor body and on the first and second laterally opposite sidewalls of the semiconductor body. A gate electrode is then formed on the gate dielectric on the top surface of the semiconductor body and adjacent to the gate dielectric on the first and second laterally opposite sidewalls of the semiconductor body. The gate electrode comprises a metal film formed directly adjacent to the gate dielectric layer. A pair of source and drain regions are then formed in the semiconductor body on opposite sides of the gate electrode.

10 Claims, 27 Drawing Sheets

U.S. PATENT DOCUMENTS

| | | | |
|---|---|---|---|
| 5,346,839 A | 9/1994 | Sundaresan | |
| 5,466,621 A | 11/1995 | Hisamoto et al. | |
| 5,545,586 A | 8/1996 | Koh | |
| 5,563,077 A | 10/1996 | Ha | |
| 5,578,513 A | 11/1996 | Maegawa | |
| 5,658,806 A | 8/1997 | Lin et al. | |
| 5,701,016 A | 12/1997 | Burroughes et al. | |
| 5,716,879 A | 2/1998 | Choi et al. | |
| 5,827,769 A | 10/1998 | Aminzadeh et al. | |
| 5,905,285 A | 5/1999 | Gardner et al. | |
| 6,251,729 B1 * | 6/2001 | Montree et al. | 438/257 |
| 6,252,284 B1 | 6/2001 | Muller et al. | |
| 6,294,416 B1 | 9/2001 | Wu | |
| 6,335,251 B2 * | 1/2002 | Miyano et al. | 438/300 |
| 6,376,317 B1 | 4/2002 | Forbes et al. | |
| 6,396,108 B1 | 5/2002 | Krivokapic et al. | |
| 6,413,802 B1 | 7/2002 | Hu et al. | |
| 6,475,869 B1 | 11/2002 | Yu | |
| 6,475,890 B1 | 11/2002 | Yu | |
| 6,483,156 B1 | 11/2002 | Adkisson et al. | |
| 6,506,692 B2 | 1/2003 | Andideh | |
| 6,525,403 B2 | 2/2003 | Inaba et al. | |
| 6,562,665 B1 | 5/2003 | Yu | |
| 6,611,029 B1 | 8/2003 | Ahmed et al. | |
| 6,635,909 B2 | 10/2003 | Clark et al. | |
| 6,645,797 B1 | 11/2003 | Buynoski et al. | |
| 6,664,160 B2 * | 12/2003 | Park et al. | 438/240 |
| 6,680,240 B1 | 1/2004 | Maszara | |
| 6,706,571 B1 | 3/2004 | Yu et al. | |
| 6,709,982 B1 | 3/2004 | Buynoski et al. | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,756,657 B1 | 6/2004 | Zhang et al. | |
| 6,764,884 B1 * | 7/2004 | Yu et al. | 438/157 |
| 6,835,618 B1 | 12/2004 | Dakshina-Murthy et al. | |
| 6,858,478 B2 | 2/2005 | Chau et al. | |
| 6,884,154 B2 | 4/2005 | Mizushima et al. | |
| 6,921,702 B2 | 7/2005 | Ahn et al. | |
| 6,921,982 B2 | 7/2005 | Joshi et al. | |
| 7,084,018 B1 * | 8/2006 | Ahmed et al. | 438/156 |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0057486 A1 | 3/2003 | Gambino | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0201458 A1 | 10/2003 | Clark et al. | |
| 2003/0227036 A1 | 12/2003 | Sugiyama et al. | |
| 2004/0031979 A1 | 2/2004 | Lochtefeld et al. | |
| 2004/0033639 A1 | 2/2004 | Chinn et al. | |
| 2004/0036118 A1 | 2/2004 | Adadeer et al. | |
| 2004/0036127 A1 | 2/2004 | Chau et al. | |
| 2004/0082125 A1 * | 4/2004 | Hou et al. | 438/240 |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0110097 A1 | 6/2004 | Ahmed et al. | |
| 2004/0119100 A1 | 6/2004 | Nowak et al. | |
| 2004/0126975 A1 | 7/2004 | Ahmed et al. | |
| 2004/0166642 A1 | 8/2004 | Chen et al. | |
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0203254 A1 | 10/2004 | Conley, Jr. et al. | |
| 2004/0227187 A1 | 11/2004 | Cheng et al. | |
| 2004/0238887 A1 | 12/2004 | Nihey | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2005/0019993 A1 * | 1/2005 | Lee et al. | 438/157 |
| 2005/0035415 A1 | 2/2005 | Yeo et al. | |
| 2005/0118790 A1 | 6/2005 | Lee et al. | |
| 2005/0127362 A1 | 6/2005 | Zhang et al. | |
| 2005/0145941 A1 | 7/2005 | Bedell et al. | |
| 2005/0148137 A1 * | 7/2005 | Brask et al. | 438/216 |
| 2005/0224797 A1 | 10/2005 | Ko et al. | |
| 2005/0233156 A1 | 10/2005 | Senzaki et al. | |
| 2005/0277294 A1 | 12/2005 | Schaeffer et al. | |
| 2006/0040054 A1 | 2/2006 | Pearlstein et al. | |
| 2006/0046521 A1 | 3/2006 | Vaarstra et al. | |
| 2006/0211184 A1 * | 9/2006 | Boyd et al. | 438/149 |

FOREIGN PATENT DOCUMENTS

| | | |
|---|---|---|
| EP | 1 202 335 A2 | 5/2002 |
| EP | 1 566 844 A2 | 8/2005 |
| JP | 2003-298051 | 10/2003 |
| WO | WO 02/43151 A | 5/2002 |
| WO | WO 2004/059726 A1 | 7/2004 |

OTHER PUBLICATIONS

International Search Report PCT/US2005/037169, mailed Feb. 23, 2006 (11 pgs.)

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deep sub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET- A Self-Aligned Double-Gate MOSFET Scalable to 20 nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Tripe Gate FinFets", IEEE 2003, pp. 135-138.

S.T. Chang et al., "3-D Simulation of Strained Si/SiGe Heterojunction FinFETs", pp. 176-177.

International Search Report PCT/US2005/010505.

International Search Report PCT/US2005/020339.

International Search Report PCT/US 03/26242 (from P14435pct).
International Search Report PCT/US 03/39727 (from P15677pct).
International Search Report PCT/US 03/40320 (from P15685pct).
International Search Report PCT/US2005/000947 (from P17814pct).
Jing Guo et al. "Performance Projections for Ballistic Carbon Nanotube Field-Effect Transistors" Applied Physics Letters, vol. 80, No. 17, pp. 3192-2194 (Apr. 29, 2002).
Ali Javey et al., "High-K Dielectrics for Advanced Carbon-Nanotube Transistors and Logic Gates", Advance Online Publication, Published online, pp. 1-6 (Nov. 17, 2002).
Richard Martel et al., "Carbon Nanotube Field Effect Transistors for Logic Applications" IBM, T.J. Watson Research Center, 2001 IEEE, IEDM 01, pp. 159-162.
Fried, David M. et al., High-Performance P-type Independent-Gate FinFETs, IEEE Electron Device Letters, vol. 25, No. 4, Apr. 2004, pp. 199-201.
Fried, David M. et al., "Improved Independent Gate N-Type FinFET Fabrication and Characterization", IEEE Electron Device Letters, vol. 24, No. 9, Sep. 2003, pp. 592-594.

Kuo, Charles et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.
Kuo, Charles et al., "A Capacitorless Double-Gate DRAM Cell Design for High Density Applications", 2002 IEEE International Electron Devices Meeting Technical Digest, Dec. 2002, pp. 843-846.
Ohsawa, Takashi et al., "Memory Design Using a One-Transistor Gain Cell on SOI", IEEE Journal of Solid-State Circuits, vol. 37, No. 11, Nov. 2002, pp. 1510-1522.
Tanaka, T. et al., Scalability Study on a Capacitorless 1T-DRAM: From Single-Gate PD-SOI to Double-Gate FinDram, 2004 IEEE International Electron Devices Meeting Technical Digest, Dec. 2004, 4 pages.
T.M. Mayer et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

* cited by examiner

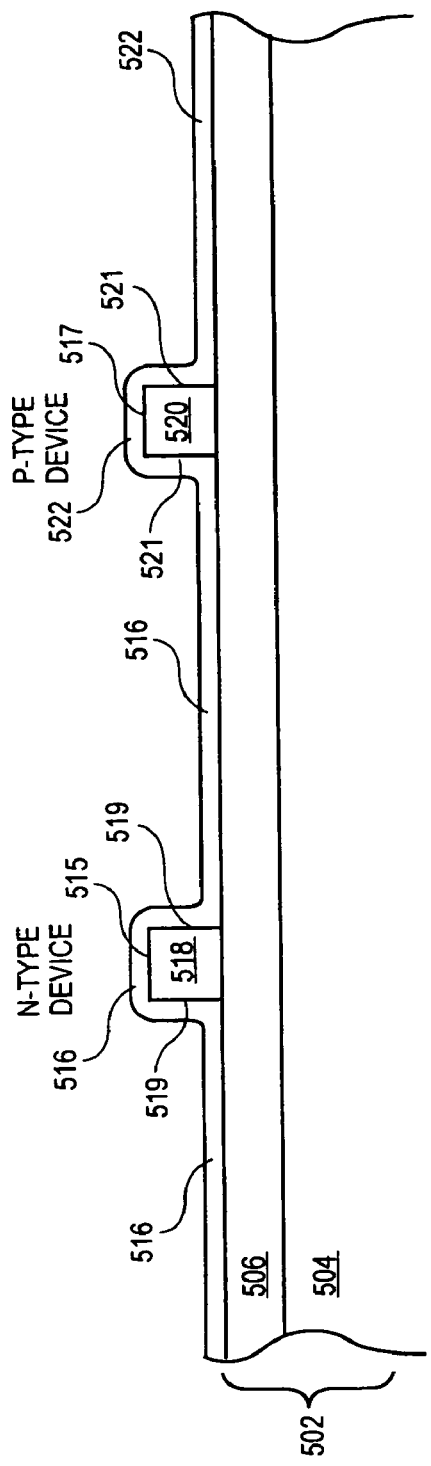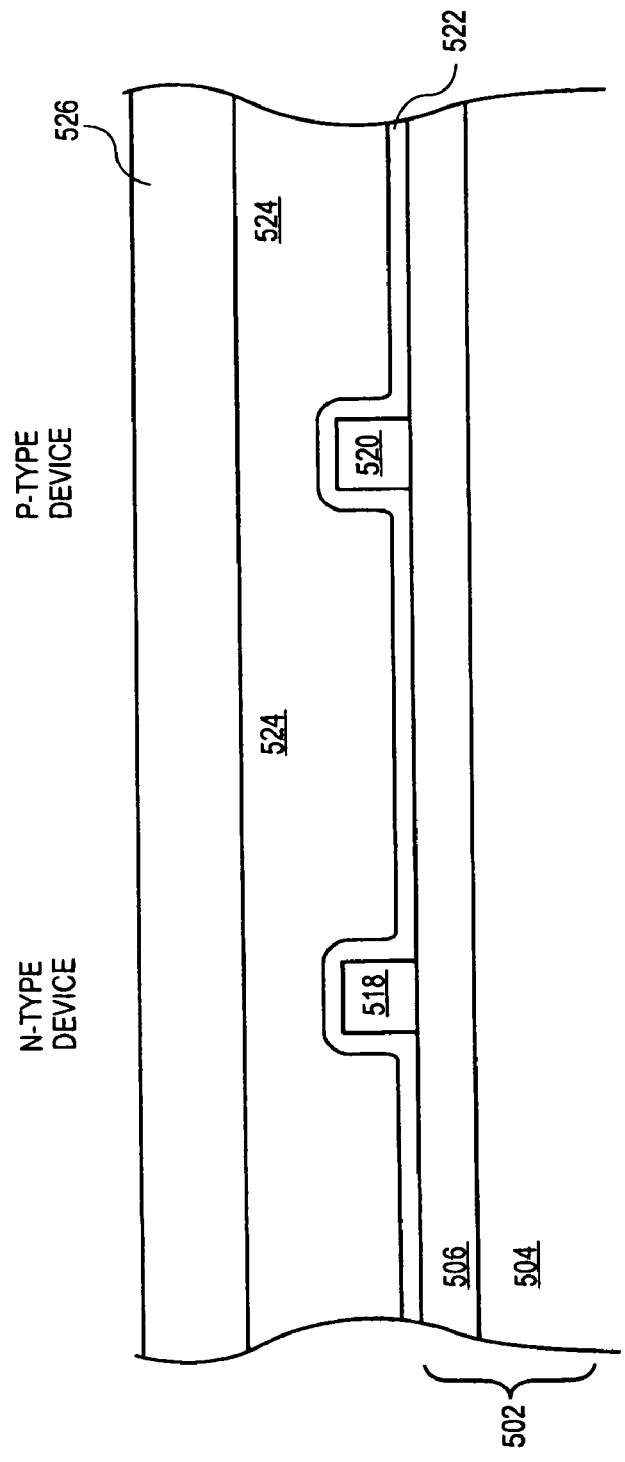

US 7,531,437 B2

METHOD OF FORMING METAL GATE ELECTRODES USING SACRIFICIAL GATE ELECTRODE MATERIAL AND SACRIFICIAL GATE DIELECTRIC MATERIAL

This is a Divisional Application of Ser. No.: 10/956,279 filed Sep. 30, 2004, now U.S. Pat. No. 7,361,958 which is presently pending.

BACKGROUND OF THE INVENTION

1. Field of the Invention

The present invention relates to the field of semiconductor integrated circuit manufacturing, and more particularly to CMOS integrated circuits with p type and n type nonplanar transistors with metal gate electrodes and methods of fabrication.

2. Discussion of Related Art

In order to increase device performance, silicon on insulator (SOI) transistors have been proposed for the fabrication of modern integrated circuits. FIG. 1 illustrates a standard fully depleted silicon on insulator (SOI) transistor 100. SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 formed on the gate dielectric 108. Source 112 and drain 114 regions are formed in the silicon body 106 along laterally opposite sides of a polysilicon gate electrode 110.

Fully depleted SOI have been proposed as a transistor structure to take advantage of ideal sub-threshold gradients for optimized on current/off current ratios. In order to achieve ideal subthreshold gradients with transistor 100, the thickness of the silicon body 106 must be about ⅓ the size of the gate length (Lg) of the transistor or Tsi=Lg/3. However, as gate lengths scale especially as they approach 30 nm, the need for ever decreasing silicon film thickness (TSi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for epitaxial silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a polysilicon gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202. Double gate (DG) device 200 essentially has two gates, one on either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where Tsi=(2×Lg)/3. The most manufacturable form of the double gate (DG) device 200, however, requires that the body 202 patterning be done with photolithography that is 0.7×smaller than that used to pattern the gate length (Lg) of the device. In order to obtain high density integrated circuits, it is generally desirable to have the most aggressive lithography occur with respect to the gate length (Lg) of the gate electrode 508. Although, double gate structures double the thickness of the silicon film (since there now is a gate on either side of the channel) these structures, however, are extremely difficult to fabricate. For example, silicon body 202 requires a silicon body etch which can produce a silicon body 202 with an aspect ratio (height to width) of about 5:1.

Another problem associated with transistors 100 and 200 shown in FIG. 1 and FIGS. 2A and 2B, is that the gate electrodes are typically formed from a doped polycrystalline silicon film. Polysilicon gate electrodes suffer from the formation of charge carrier depletion regions also known as "poly depletion". That is, when a voltage is applied to the polycrystalline gate electrode, a depletion region 120 and 220 forms in the lower part of the polycrystalline gate electrode adjacent to the gate dielectric layer 108 and 206 respectively. The result in affect is an increase in the electrical thickness of the gate dielectric layer. For example, in order to fabricate a transistor, such as shown in FIG. 1, with a 90 nanometer gate length, a 14 Å thick silicon oxide dielectric layer is necessary for optimal electrical performance. However, in such a device, the poly depletion region 120 can be on the order of 5 Å thereby essentially increasing the electrical thickness (TOx) of the gate dielectric layer by 33%. Such an increase in the gate dielectric electrical thickness dramatically reduces the performance of the fabricated transistor. It is to be appreciated, that as device dimensions are scaled down, in order to integrate an ever larger number of transistors into a single integrated circuit in the electrical thickness of the gate oxide layer must also be proportionally scaled down. Poly depletion effects hinder the ability to further scale down transistor dimensions.

DETAILED DESCRIPTION OF THE PRESENT INVENTION

Figure 1:
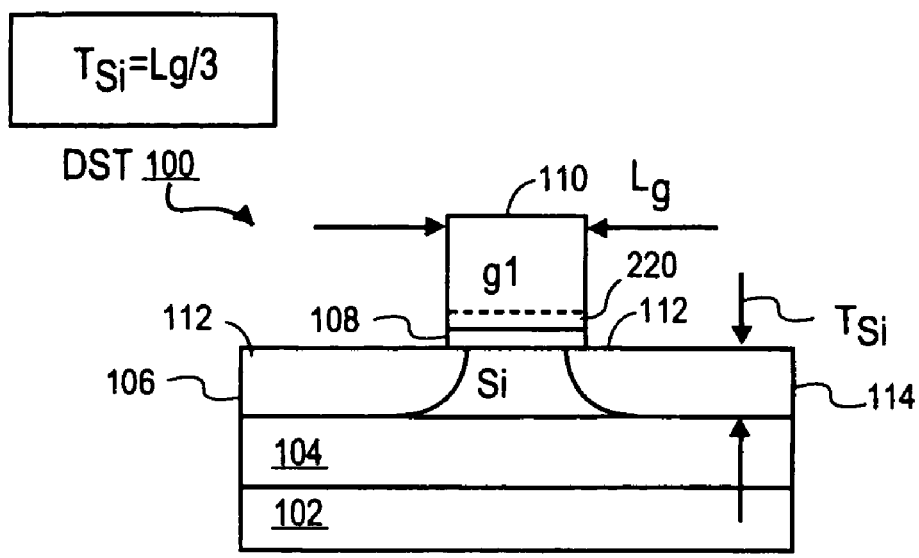
FIG. 1 is an illustration of a cross-sectional view of a depleted substrate transistor
Figure 2A:
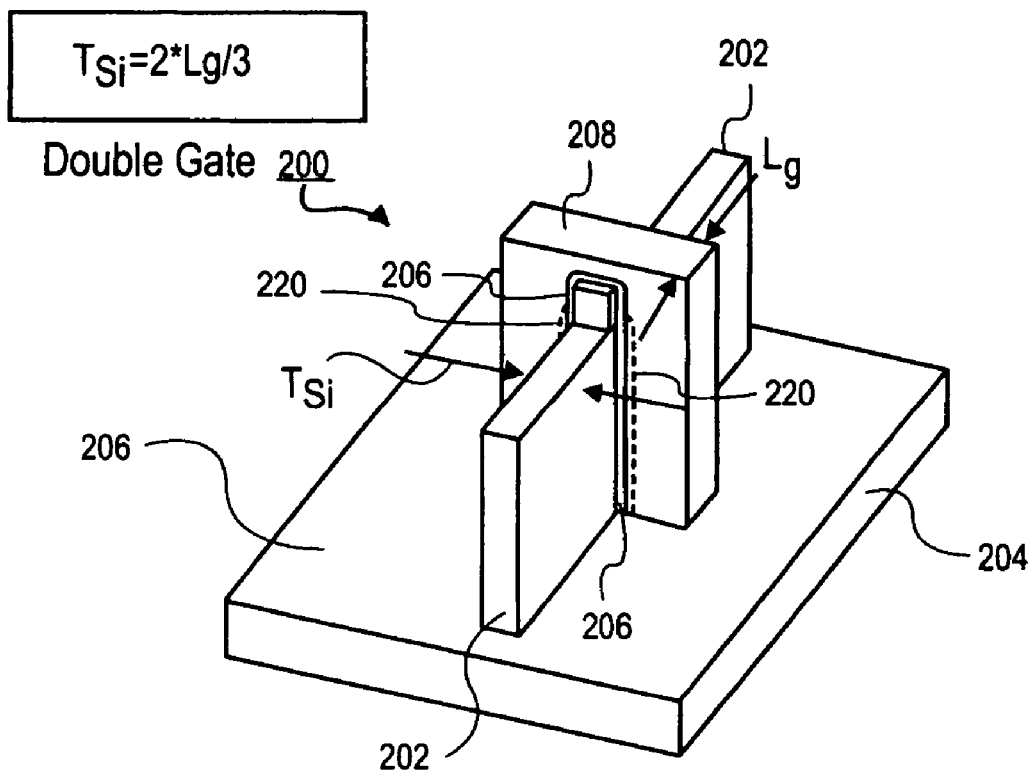
FIGS. 2A and 2B illustrate a double gate depleted substrate transistor.
Figure 2B:
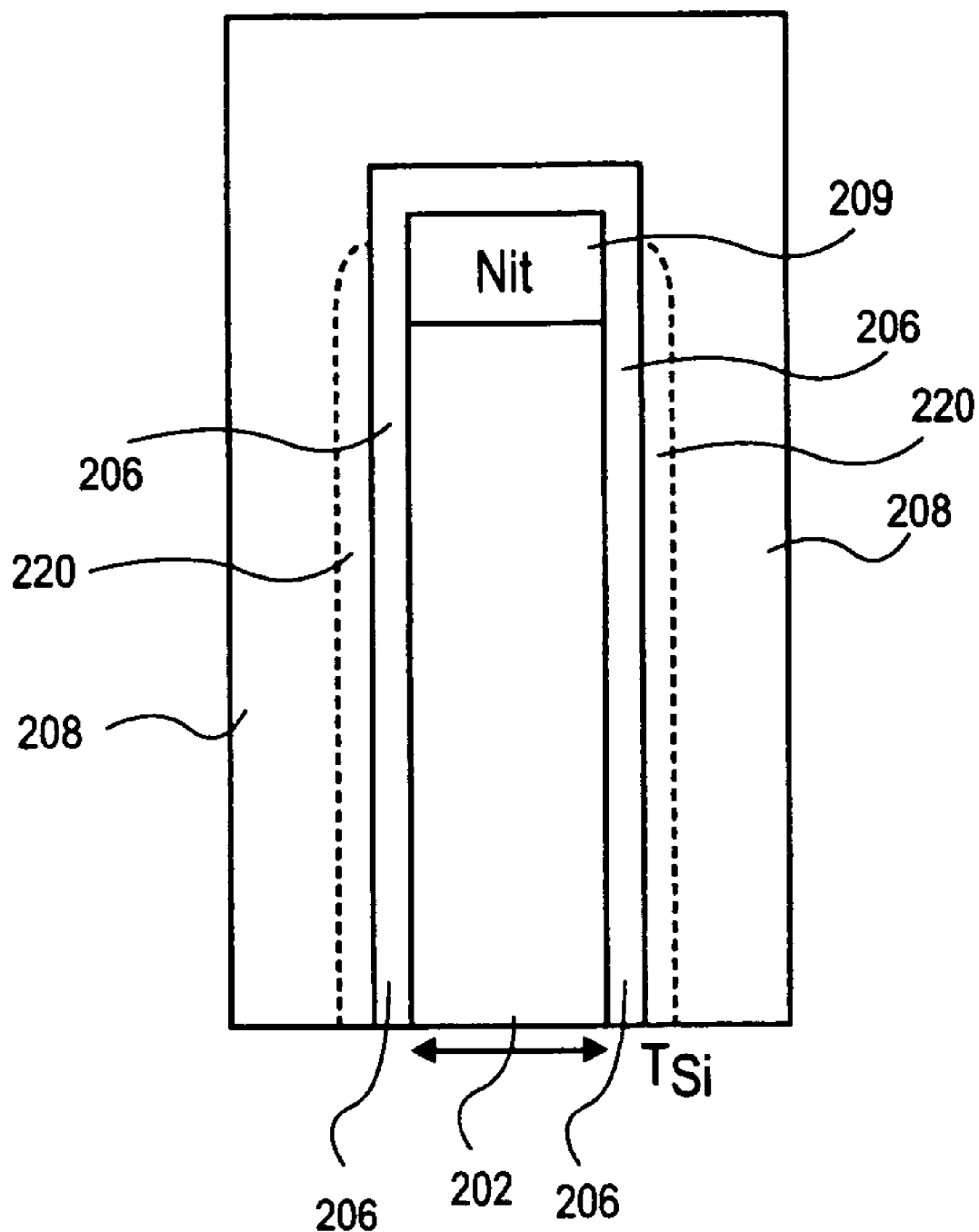

A nonplanar transistor having a gate electrode comprising a lower metal layer is described. In the following description numerous specific details are set forth in order to provide a thorough understanding of the present invention. In other instances, well known semiconductor processing techniques and features have not been described in particular detail in order to not unnecessarily obscure the present invention.

The present invention is a novel nonplanar transistor having a metal gate electrode and its method of fabrication. A nonplanar device includes a semiconductor body having a top surface and laterally opposite sidewalls formed on a substrate. A gate dielectric is formed on the top surface and on the sidewalls of the channel region of the semiconductor body. A metal gate electrode is then formed around the semiconductor body so that it covers the top surface and two sides of the semiconductor body. Since the gate electrode covers the semiconductor body on three sides the transistor essentially has three gate electrodes, one on the top of the semiconductor body and one on each of the sidewalls of the semiconductor body. Such a nonplanar transistor can be referred to as a trigate transistor since it essentially has three gate electrodes. Because the channel region of the semiconductor body is covered by the gate electrode on three sides, the electrical field provided by the gate electrode can easily fully deplete the channel region of the device. Fully depleted transistors have advantageous electrical characteristics, such as increased drive current as well as low leakage current. The nonplanar device of the present invention has a metal gate electrode. A metal gate electrode prevents charge carrier depletion phenomenon associated with conventional polysilicon gate electrodes. The use of a metal gate electrode reduces the $T_{ox}$ or electrical thickness of the effective gate dielectric which thereby improves the electrical performance of the device.

In an embodiment of the present invention, a replacement gate technique is utilized to form the gate electrodes. In a replacement gate technique a sacrificial gate electrode and sacrificial gate dielectric are formed over the semiconductor body. Standard source and drain doping and formation techniques including sidewall spacers can then be formed. A dielectric layer is then blanket deposited over the sacrificial gate electrode and the semiconductor body. The dielectric layer is then polished back to expose the top surface of the sacrificial gate electrode. The sacrificial gate electrode can then be removed to form a trench or opening which defines where the gate electrode is to be formed. At this stage, the option to replace a sacrificial gate dielectric (e.g. to replace a "dummy" SiO2 layer with a high K dielectric film such as HfO2) may be considered. A metal film is then blanket deposited over the insulating substrate and into the trench and over the semiconductor body in the trench. The metal film is then polished back to form the gate electrode for the device.

In the following description various processing techniques and device structures are set forth which can be used alone or in combination to improve device reliability and performance and to provide a manufacturable method of fabrication. In embodiments of the present invention, various techniques are utilized to preserve the sacrificial interlayer dielectric film used to form the openings for the gate electrode in a replacement gate process.

For example, in an embodiment of the present invention, a hard mask material is used to pattern the sacrificial gate electrodes for the n type and p type transistors. A hard mask helps provide for improved etching and patterning of the sacrificial gate electrode. In embodiments of the present invention, the hard mask also provides a polish stop for the polishing of the sacrificial interlayer dielectric used for forming the opening for replacement gate process. Stopping on the hard mask, as opposed to the sacrificial gate electrode, provides for an extra margin of ILD thickness to insure that nonuniform polishing or dishing does not uncover the transistor structure located below. Additionally, in embodiments of the present invention, both the sacrificial gate electrode for the n type device and sacrificial gate electrode for the p type device are removed simultaneously and both openings filled simultaneously with the same film or stack of films. In this way, only a single polish process is necessary to form the gate electrodes for the n type device and p type device thereby helping to preserve the sacrificial interlayer dielectric layer and insure that the polishing processes do not reveal or uncover the underlying device structure. Because the gate electrode for the p type device and n type device are fabricated at the same time, they need to be fabricated from the same material or stack of materials, such as a midgap work function material. Unfortunately, fabricating the gate electrode for the n type device and p type device with the same material (e.g., a midgap work function material) does not provide the optimal electrical and performance characteristics for the devices. Accordingly, in embodiments of the present invention, the source/drain doping concentration and profile as well as the channel region doping concentration and profile are tailored to provide between a 0.9 eV-1.1 eV threshold voltage difference between the gate electrodes for the p type device and n type device. In this way, device performance for the p type and n type devices can still be optimized even though the gate electrodes are fabricated with the same material.

Additionally, in embodiments of the present invention, the thickness of the hard mask material, sacrificial gate electrode material and semiconductor body are designed so that when spacers are formed adjacent to the sacrificial gate electrode, the spacer etch can include an "over etch" to remove the spacer material from the sidewalls of the semiconductor body but yet still have the top of the sidewall spacers adjacent to the hard mask material on the sacrificial gate electrode. In this way, the sacrificial gate electrode can be completely sealed by the hard mask material and the spacer material thereby preventing silicon and silicide from forming on the sacrificial gate electrode during the process used to form silicon and silicide on the semiconductor body. Additionally, in embodiments of the present invention, after the removal of the sacrificial gate electrode and gate dielectric materials the channel of the semiconductor body is exposed to a surface treatment solution, such as solution comprising hydrogen peroxide, which makes the surface hydrophilic. A hydrophilic surface treatment enables a high dielectric constant metal oxide dielectric film to be deposited on the channel region of the semiconductor body with an atomic layer deposition (ALD) process whereby the film is formed one layer at a time. Such a process forms a high quality extremely uniform thickness gate dielectric film. It is to be appreciated that other valuable features and combinations thereof will become apparent from the detailed description which follows.

Figure 3:
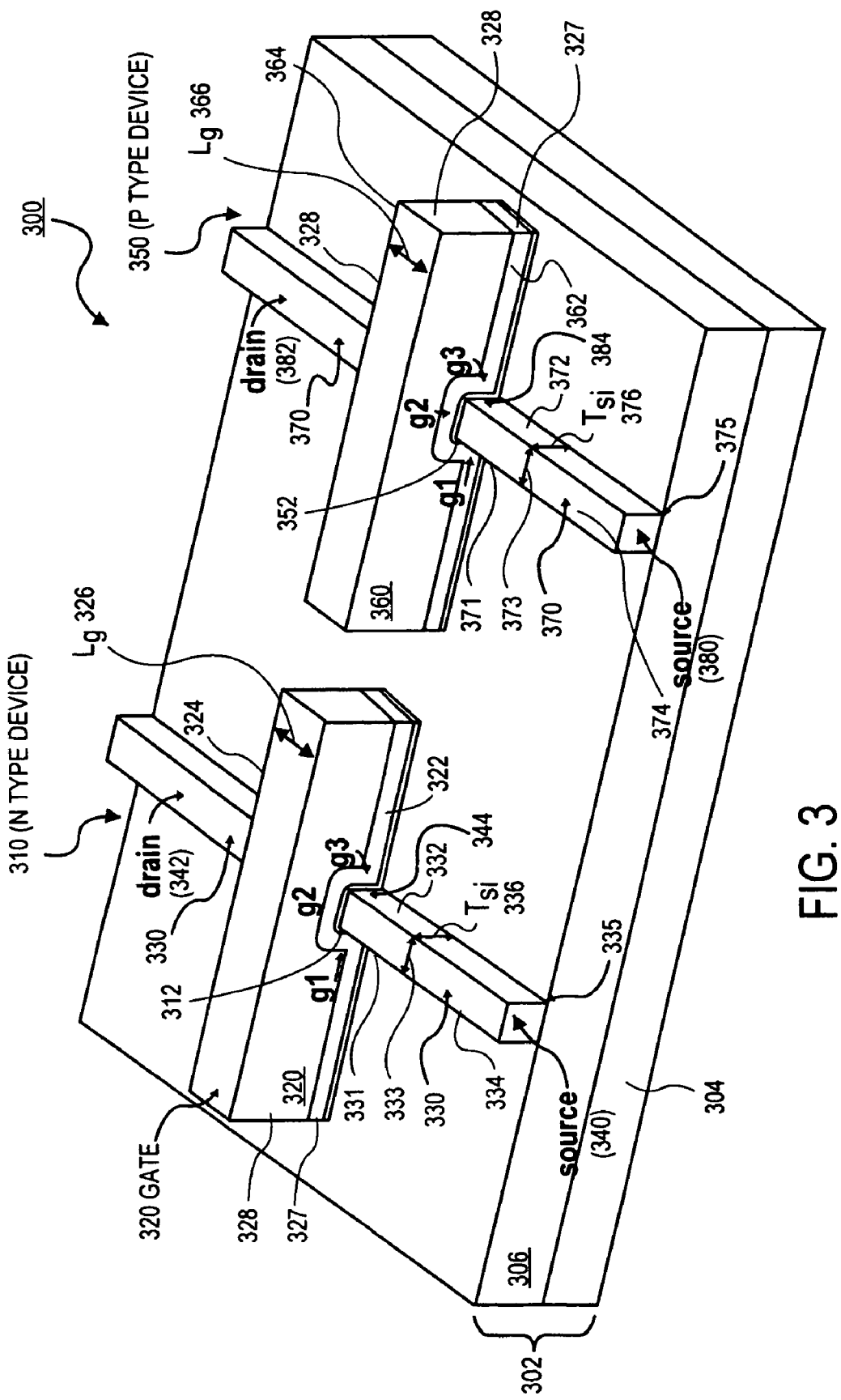
FIG. 3 is an illustration of a CMOS integrated circuit comprising a nonplanar n type transistor having a metal gate electrode and a nonplanar p type transistor having a metal gate electrode.

An example of a nonplanar transistors in accordance with the present invention are illustrated in FIG. 3. FIG. 3 shows a portion of a complimentary metal oxide semiconductor (CMOS) integrated circuit 300 which includes both an n type nonplanar transistor 310 with a metal gate electrode 320 and p type nonplanar transistor 350 with a metal gate electrode 352 formed on an insulating substrate 302. An n type transistor 310 is a field effect transistor where the carriers are electrons and a p type transistor 350 is a transistor where the carriers are holes. N type transistor 310 and p type transistor 350 coupled together through higher levels of metallization into a functional CMOS circuit. Although, a CMOS integrated circuit 300 is shown and described with respect to FIG. 3, the present invention is not limited to a CMOS integrated circuit and can include circuits which include only a p type non-planar transistors with a metal gate electrodes or only an n type nonplanar transistors with metal gate electrodes.

CMOS integrated circuit 300 can be formed on an insulating substrate 302. In an embodiment of the present invention, insulating substrate 302 includes a lower monocrystalline silicon substrate 304 upon which formed in insulating layer 306, such as a silicon dioxide film. Integrated circuit 300, however, can be formed on any suitable insulating substrate, such as substrates formed from silicon dioxide, nitrides, oxides, and sapphires.

Additionally, in an embodiment of the present invention, substrate 302 need not necessarily be an insulating substrate can be a well known semiconductor substrate, such as but not limited to a monocrystalline silicon substrate and gallium arsenide substrate.

N type nonplanar transistor 310 includes a semiconductor body 330 formed on insulating layer 306 of insulating substrate 302 and p type nonplanar transistor 350 includes a semiconductor body 370 formed on insulating layer 306 of insulating substrate 302. Semiconductor bodies 330 and 370 can be formed from any well known semiconductor material, such as but not limited to silicon, germanium, silicon germanium ($Si_xGe_y$), gallium arsenide (GaAs), InSb, GaP, GaSb, carbon nanotubes and carbon nanowires. Semiconductor bodies 330 and 370 can be formed of any well know material which can be reversibly altered from an insulating state to a conductive state by applying external electrical controls. Semiconductor bodies 330 and 370 are ideally a single crystalline film when the best electrical performance of transistors 310 and 350 is desired. For example, semiconductor bodies 330 and 370 are single crystalline films when CMOS integrated circuit 300 is used in high performance applications, such as in high density circuits, such as a microprocessor. Semiconductor bodies 330 and 370, however, can be a polycrystalline films when CMOS integrated circuit 300 is used in applications requiring less stringent performance, such as in liquid crystal displays. Insulating layer 306 insulates semiconductor bodies 330 and 370 from the monocrystalline silicon substrate 302. In an embodiment of the present invention, semiconductor bodies 330 and 370 are single crystalline silicon films.

Semiconductor body 330 has a pair of laterally opposite sidewalls 331 and 332 separated by distance which defines a semiconductor body width 333. Additionally, semiconductor body 330 has top surface 334 opposite a bottom surface 335 formed on substrate 302. The distance between the top surface 334 and the bottom surface 335 defines the body height 336. In an embodiment of the present invention, the body height 336 is substantially equal to the body width 335. In an embodiment of the present invention, the body 330 has a width 333 and a height 336 less than 30 nanometers and ideally less than 20 nanometers. In an embodiment of the present invention, the body height 336 is between one half the body width 333 to two times the body width 333.

Similarly, semiconductor body 370 has a pair of laterally opposite sidewalls 371 and 372 separated by a distance 373 which defines a semiconductor body width 373. Additionally, semiconductor body 370 has a top surface 374 opposite a bottom surface 375 formed on substrate 302. The distance between the top surface 374 and the bottom surface 375 defines the body height 376. In an embodiment of the present invention, the body height 376 is substantially equal to the body width 373. In an embodiment of the present invention, the body 370 has a width 373 and a height 376 less than 30 nanometers and ideally less than 20 nanometers. In an embodiment of the present invention the body height 376 is between one half the body width 373 to two times the body width 373.

N type nonplanar transistor 310 has a gate dielectric layer 312. Gate dielectric layer 312 is formed on and around three sides of semiconductor body 330 as shown in FIG. 3. Gate dielectric layer 312 is formed on or adjacent to sidewall 331, on the top surface 334, and on or adjacent to sidewall 332 of body 330 as shown in FIG. 3. Similarly, nonplanar p type transistor 350 has a gate dielectric layer 352. Gate dielectric layer 352 is formed on and around three sides of semiconductor body 370 as shown in FIG. 3. Gate dielectric layer 352 is formed on or adjacent to sidewall 371, on the top surface 374 and on or adjacent to sidewall 372 of body 370 as shown in FIG. 3. Gate dielectric layers 312 and 352 can be formed from any well known gate dielectric films. In an embodiment of the present invention, the gate dielectric layers are silicon dioxide ($SiO_2$), silicon oxynitride ($SiO_xN_y$), or a silicon nitride ($Si_3N_4$) dielectric layer or combinations thereof. In an embodiment of the present invention, the gate dielectric layer 312 and 352 are a silicon oxynitride film formed to a thickness between 5-20 Å. In an embodiment of the present invention, the gate dielectric layer 312 and 352 are a high K gate dielectric layer, such as a metal dielectric, such as but not limited to tantalum oxide, titanium oxide, hafnium oxide, zirconium oxide, aluminum oxide, lanthanum oxide, lanthanum aluminum oxide and silicates thereof. In an embodiment of the present invention, dielectric layer 312 and 352 can be other types of high K dielectric layers, such as but not limited to PZT and BST.

N type nonplanar device 310 has a gate electrode 320. Gate electrode 320 is formed on and around gate dielectric layer 312 as shown in FIG. 3. Gate electrode 320 is formed on or adjacent to gate dielectric layer 312 formed on sidewall 331 of semiconductor body 330, is formed on gate dielectric layer 312 formed on the top surface 334 of semiconductor body 330, and is formed adjacent to or on gate dielectric layer 312 formed on sidewall 332 of semiconductor body 320. Gate electrode 320 has a pair of laterally opposite sidewalls 322 and 324 separated by a distance which defines the gate length 326 of n type transistor 310. In an embodiment of the present invention, the laterally opposite sidewalls 322 and 324 of the gate electrode 320 run in a direction perpendicular to the laterally opposite sidewalls 331 and 332 of semiconductor body 330. Similarly, p type nonplanar device 350 has a gate electrode 360 formed on and around gate dielectric layer 352 as shown in FIG. 3. Gate electrode 360 is formed on or adjacent to gate dielectric layer 352 formed on sidewall 371 of semiconductor body 370, is formed on gate dielectric layer 352 formed on the top surface 374 of semiconductor body 370 and is formed adjacent to or on gate dielectric layer 352 formed on sidewall 372 of semiconductor body 370. Gate electrode 370 has a pair of laterally opposite sidewalls 362 and 364 separated by a distance which defines a gate length (Lg) 366 of p type transistor 350. In an embodiment of the present invention, the laterally opposite sidewalls 362 and 364 of gate electrode 360 run in a direction perpendicular to laterally opposite sidewalls 371 and 372 of semiconductor body 370.

In an embodiment of the present invention, gate electrodes 320 and 360 are formed from the same film or composite stack of films. In an embodiment of the of the present invention, gate electrodes 320 and 360 are formed from a material having a midgap work function or a work function between a n type device and a p type device. In an embodiment of the present invention, when the semiconductor bodies 330 and 370 are silicon bodies, gate electrodes 320 and 360 can be formed of a material having a midgap work function between 4.2-4.8 eV. In an embodiment of the present invention, gate electrodes 320 and 360 include a film selected from the group consisting of nitrides and carbides of titanium, hafnium and tantalum, with a workfunction between 4.2-4.8 eV and ideally between 4.4-4.5 eV. In an embodiment of the present invention, gate electrodes 320 and 360 are formed from a composite film comprising a lower metal film 327 and an upper metal or doped polysilicon film 328. In an embodiment of the present invention, the lower metal film 327 controls the work function of the gate electrode material. In an embodiment of the present invention, the lower metal portion 327 of the gate electrodes 320 and 360 is formed to a thickness of at least 25 Å or four monolayers so that the work function of the gate electrode material is controlled by the lower metal film. That is, in an embodiment of the present invention, the lower metal film is formed thick enough so that it is not "work function transparent" so that the work function of the gate electrode material is controlled by the lower metal film 327 and not by the upper metal film 328. In an embodiment of the present invention, the lower metal film 327 is formed to a thickness between 25-100 Å and is formed from nitride or carbides of titanium and tantalum, such as but not limited to TaN, TiN, and aluminum doped titanium carbide. In an embodiment of the present invention, the upper metal film 328 is formed of a material which has good gap fill characteristics and which has low resistance, such as but not limited tungsten (W), copper (Cu), or doped polysilicon.

N type nonplanar transistor 310 has a source region 340 and a drain region 342. Source region 340 and drain region 342 are formed in semiconductor body 308 on opposite sides of gate electrode 320 as shown in FIG. 3. Source region 340 and drain region 342 are formed of n type conductivity. In an embodiment of the present invention, source 340 and drain region 342 have a n type dopant concentration between $1 \times 10^{19}$ to $1 \times 10^{21}$ atoms/cm$^3$. Source region 340 and drain region 342 can be a uniform concentration or can include subregions of different concentrations or dopant profiles, such as tip regions (e.g., source/drain extensions). In an embodiment of the present invention, when nonplanar n type transistor 310 is a symmetrical transistor, source region 340 and drain region 342 have the same doping concentration and profile. In an embodiment of the present invention, the nonplanar n type transistor 310 is formed as an asymmetrical transistor wherein the doping concentration profile of the source region 340 and drain region 342 may vary in order to obtain particular electrical characteristics.

Similarly, p type nonplanar transistor 350 has a source region 380 and drain region 382. Source region 380 and drain region 382 are formed in semiconductor body 370 on opposite sides of gate electrode 360 as shown in FIG. 3. The source region 380 and the drain region 382 are formed of p type conductivity. In an embodiment of the present invention, the source region 380 and drain region 382 have a p type doping concentration of between $1 \times 10^{19}$ to $1 \times 10^{21}$ atoms/cm$^3$. Source region 380 and drain region 382 can be formed of uniform concentration or can include subregions of different concentration dopants profiles, such as tip regions (e.g., source/drain regions extensions). In an embodiment of the present invention, when nonplanar p type transistor 350 is a symmetrical transistor, source region 380 and drain 382 have the same doping concentration and profile. In the embodiment of the present invention, when p type nonplanar transistor 350 is formed as an asymmetrical transistor, then the doping concentration profile of source region 380 and drain region 382 may vary in order to obtain particular electrical characteristics.

The portion of semiconductor body 330 located between source region 340 and drain region 342 defines a channel region 344 of the n type nonplanar transistor 310. The channel region 344 can also be defined as the area of the semiconductor body 330 surrounded by the gate electrode 320. Similarly, the portion 384 of semiconductor body 370 located between source region 380 and drain region 382 defines a channel region 384 of p type nonplanar transistor 350. Channel region 384 can also be defined as the area of the semiconductor body 370 surrounded by gate electrode 360. The source/drain regions typically extend slightly beneath the gate electrodes through, for example, diffusion to define a channel region slightly smaller than the gate electrode length (Lg). In an embodiment of the present invention, the channel regions 344 and 384 are intrinsic or undoped monocrystalline silicon. In an embodiment of the present invention, channel regions 344 or 384 are doped monocrystalline silicon. When channel region 344 is doped, it is typically doped to a p type conductivity level between intrinsic and $4 \times 10^{19}$ atoms/cm$^3$. When channel region 384 is doped it is typically doped to a n type conductivity level between intrinsic and $4 \times 10^{19}$ atoms/cm$^3$. In an embodiment of the present invention, channel regions 344 and 384 are doped to a concentration between $1 \times 10^{18}$-$1 \times 10^{19}$ atoms/cm$^3$. Channel regions 344 and 384 can be uniformly doped or can be doped nonuniformly or with different concentrations to provide particular electrical performance characteristics. For example, channel regions 344 and 384 can include well known "halo" regions, if desired.

By providing a gate dielectric 312 and a gate electrode 320 which surrounds the semiconductor body 330 on three sides, the n type nonplanar transistor 310 is characterized in having three channels and three gates, one gate (g1) which extends between the source and drain regions on side 331 of semiconductor body 330, a second (g2) which extends between the source and drain regions on the top surface 334 of semiconductor body 330, and a third (g3) which extends between the source and drain regions on the sidewall 332 of semiconductor body 330. As such, nonplanar transistor 310 can be referred to as a tri-gate transistor. The gate width (Gw) of the transistor 310 is the sum of the width of the three channel regions. That is, gate width of transistor 310 is equal to the height 336 of semiconductor body 330 at sidewall 331, plus the width of semiconductor body 330 at the top surface 334, plus the height 336 of semiconductor body 330 at sidewall 332. Similarly, by providing a gate dielectric 352 and a gate electrode 360 which surrounds a semiconductor body 370 on three sides, nonplanar p type transistor 350 is characterized as having three channels and three gates, one channel and gate (g1) which extends between the source and drain regions on side 371 of semiconductor body 370, a second channel and gate (g2) which extends between the source and drain regions on the top surface 374 of semiconductor body 370, and a third channel and gate (g3) which extends between the source and drain regions on a sidewall 372 of semiconductor body 370. As such, nonplanar transistor 350 can be referred to as a tri-gate transistor. The gate "width" (Gw), a transistor 350 is a sum of the width of the three channel regions. That is, the gate width of the transistor 350 is equal to the height 376 of semiconductor body 370 at sidewall 371, plus the width 373 of semiconductor body 370 at the top surface 374, plus the height 376 of the semiconductor body 370 of sidewall 372. Larger width n type and p type nonplanar transistor can be obtained by using multiple devices coupled together (e.g., multiple silicon bodies 330 surrounded by a single gate electrode 320 or multiple semiconductor bodies 370 surrounded by a single gate electrode 360).

Because the channel regions 344 and 384 are surrounded on three sides by gate electrode 320 and 360, transistors 310 and 350 can be operated in a fully depleted manner wherein when transistors 310 and 350 are turned "on" the channel region 350 fully depletes thereby providing the advantageous electrical characteristics and performance of a fully depleted transistor. That is, when transistors 310 and 350 are turned "ON" a depletion region is formed in the channel region along with an inversion layer at the surfaces of the channel regions 344 and 384 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel regions 344 and 384, thus the transistor can be said to be a "fully depleted" transistor. Fully depleted transistors have improved electrical performance characteristics over non-fully depleted or partially depleted transistors. For example, operating transistors 310 and 350 in a fully depleted manner, gives the transistors an ideal or very steep subthreshold slope. Nonplanar transistors 310 and 350 can be fabricated with very steep sub-threshold slope of less than 80 mV/decade, and ideally about 60 mV/decade even when fabricated with semiconductor body thicknesses of less than 30 nm. Additionally, operating transistors 310 and 350 in the fully depleted manner, transistors 310 and 350 have improved drain induced barrier (DIBL) lowing effect which provides for better "OFF" state leakage which results in lower leakage and thereby lower power consumption. In an embodiment of the present invention the nonplanar transistors 310 and 350 have a DIBL effect of less than 100 mV/V and ideally less than 40 mV/V. It is to be appreciated that transistor 310 and 350 need not necessarily be operated in a fully depleted manner, if desired (e.g., semiconductor bodies can be made large so they do not fully deplete).

The transistors 310 and 350 of the present invention can be said to be a nonplanar transistor because the inversion layer of the channel regions 344 and 384 are formed in both the horizontal and vertical directions in semiconductor bodies 330 and 370. The semiconductor device of the present invention can also be considered a nonplanar device because the electric field from the gate electrode 320 and 360 are applied from both horizontal (g2) and vertical sides (g1 and g3).

Figure 4A:
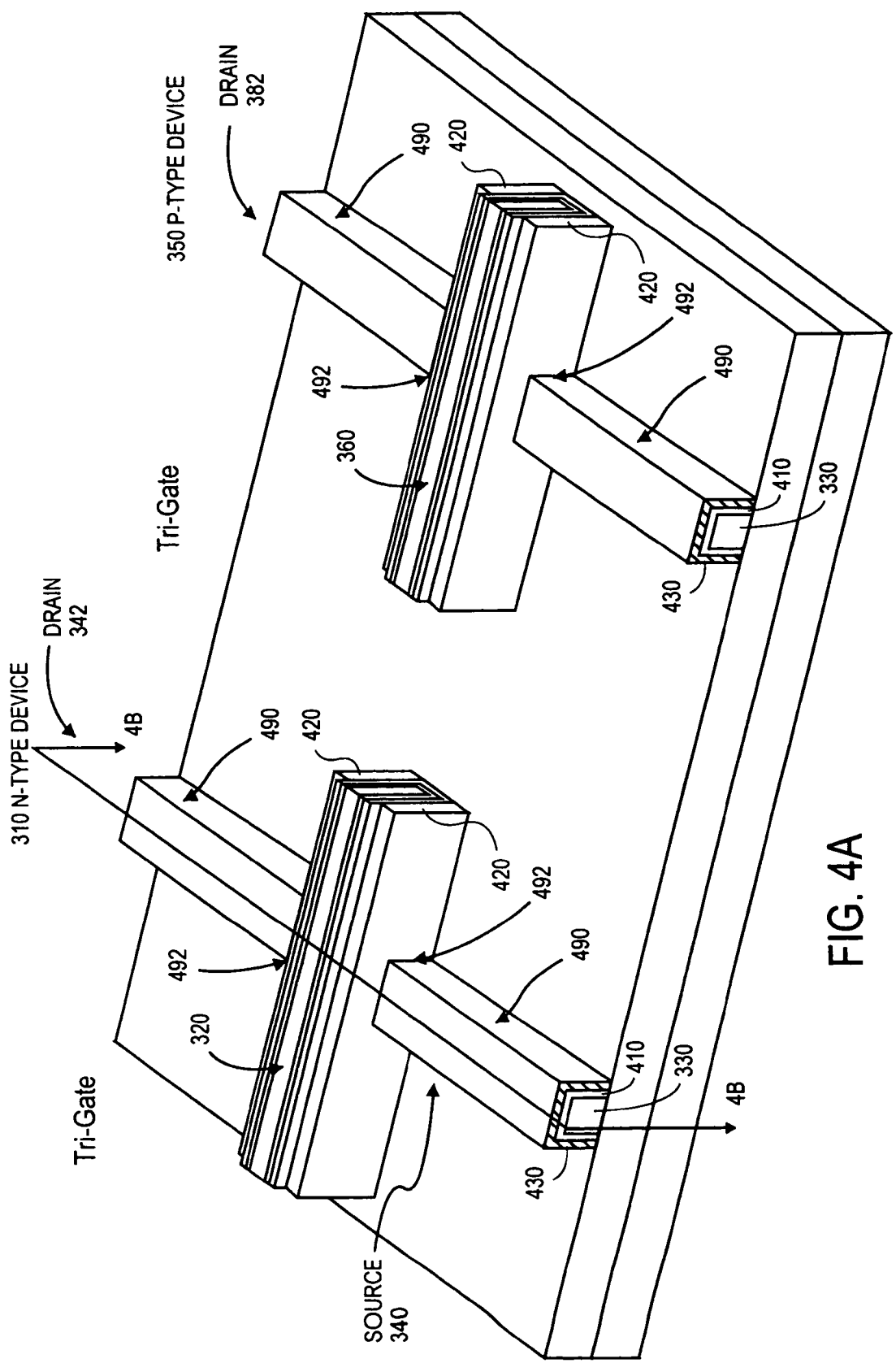
FIG. 4A illustrates a CMOS integrated circuit having an n type nonplanar transistor with a metal gate electrode which includes raised source and drain regions and silicided regions and a nonplanar p type transistor with a metal gate electrode and with raised source and drain regions and silicided regions.
Figure 4B:
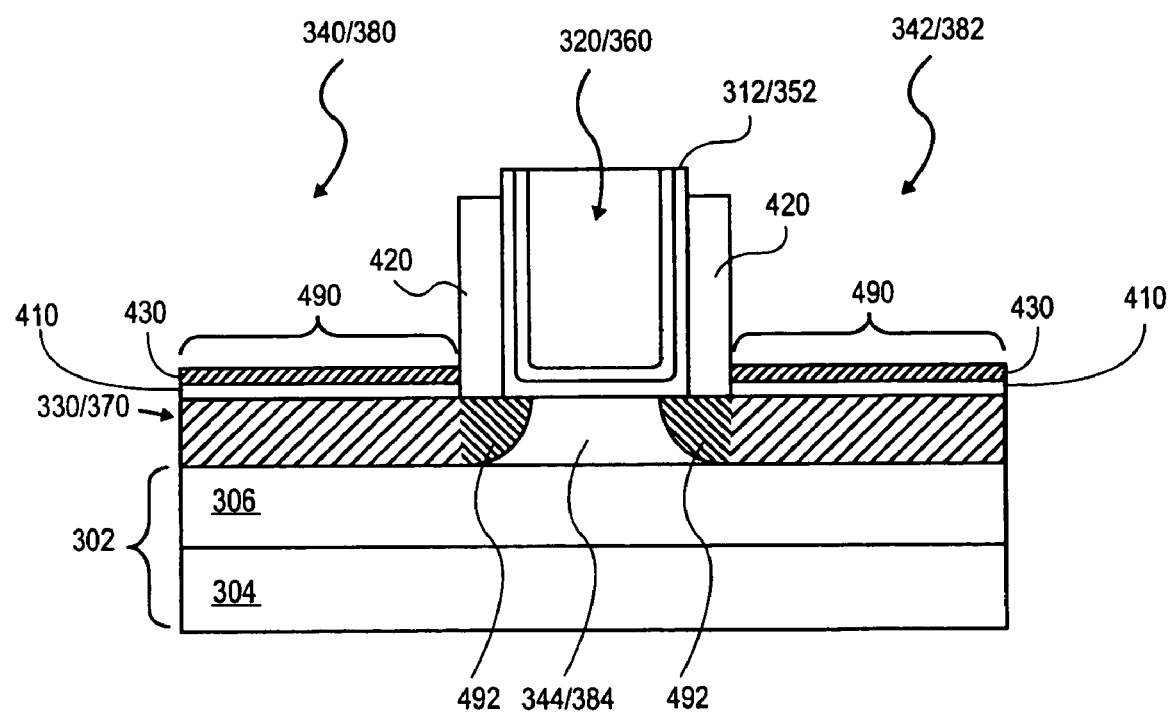
FIG. 4B illustrates a cross-sectional view of a nonplanar transistor with a metal gate electrode which includes raised source and drain regions and silicided regions.

In an embodiment of the present invention, as illustrated in FIGS. 4A and 4B, the source/drain regions comprise source/drain contact regions 490 and source/drain extension regions 492. A pair of sidewall spacers 420 formed along the sidewalls of gate electrodes 320 and 360 are used to form and define the contact regions 490 and extension regions 492. As better illustrated in FIG. 4B, which is a cross-sectional view of the devices 310/3 50 taken through the semiconductor bodies 330/370, the source/drain extension regions 492 comprise the portion of the source/drain regions formed in the semiconductor body located beneath sidewall spacers 420 and beneath a portion of the outside edges of the gate electrode 320/360. The source/drain extensions 492, which extend from the outside edge of spacer 420 to just under gate 320/360, are formed of the same conductivity type as a source/drain contact region 490 but are formed to a lower concentration level than the source/drain contact regions 490.

The source/drain contact regions 490 include the portion of the source/drain regions adjacent to the outside edges of the sidewall spacers 420 formed along the gate electrode as shown and illustrated in FIGS. 4A and 4B. In an embodiment of the present invention, the source/drain contact regions 490 included a silicon or other semiconductor film formed on and around the semiconductor bodies 330/370 as shown in FIGS. 4A and 4B.

Semiconductor film 410 can be a silicon film or a silicon alloy such as silicon germanium ($Si_xGe_y$). In an embodiment of the present invention the semiconductor film 410 is a single crystalline silicon film formed of the same conductivity type as the source region and drain region. In an embodiment of the present invention the semiconductor film can be a silicon alloy such as silicon germanium where silicon comprises approximately 1 to 99 atomic percent of the alloy and can even extend to pure (100%) Ge, or alternatively be graded. The semiconductor film 410 need not necessarily be a single crystalline semiconductor film and in an embodiment can be a polycrystalline film. In an embodiment of the present invention the semiconductor film 410 is formed on the source region and on the drain region of semiconductor body to form "raised" source and drain contact regions. Semiconductor film 410 is electrically isolated from the gate electrode by the pair of dielectric sidewall spacers 420 such as silicon nitride or silicon oxide or composites thereof. Sidewall spacers 420 run along the laterally opposite sidewalls of gate electrodes 320 and 360 as shown in FIG. 4A thereby isolating the semiconductor film 410 from gate electrode as shown in FIG. 4A. An embodiment of the present invention sidewalls spacers 420 have a thickness of between 20-300 Å. By adding a silicon or semiconductor film 420 to the source and drain regions of the semiconductor body and forming "raised" source and drain regions, the thickness of the source and drain regions is increased thereby reducing the source/drain contact resistance to transistors 310 and 350 and improving their electrical characteristics and performance.

In an embodiment of the present invention the source/drain contact regions 490 include a silicide film 430, such as, but not limited to, titanium silicide, nickel silicide, and cobalt silicide. In an embodiment of the present invention silicide film 430 is formed on a silicon film 410 on silicon body 330 and silicon body 370 as shown in FIG. 4A and 4B. Silicide film 430 however can also be formed directly onto silicon bodies 330 and 370. For example, silicide film 430 can be formed on silicon bodies 330 and 370 by first forming a silicon film such as an undoped silicon film on silicon bodies 330 and 370 and then completely consuming the silicon film during the silicide process. Dielectric spacers 420 enables silicide film 430 to be formed on semiconductor bodies 330 and 370 or on silicon film 410 in a self-aligned process (i.e., a salicide process).

In an embodiment of the present invention, the doping concentrations of the source/drain extension regions 492 of the n type device and p type device along with the doping concentration of the channel regions 344/384 are designed so that an 0.9-1.1 eV difference is obtained between the threshold voltage or work function of the gate electrode for the n type device and the gate electrode for the p type device even though the gate electrodes are formed from the same midgap material or stack of materials. In an embodiment of the present invention, the source/drain extension doping and channel doping are able to effect a gate electrode for the p type device with a threshold voltage or work function between 4.9 to 5.2 eV and a gate electrode for the n type device with a threshold voltage or work function between 3.9 to 4.2 eV when a mid-gap gate electrode material is employed (e.g. a metal gate electrode with stand-alone workfunction in the range 4.3-4.8 eV).

In an embodiment of the present invention, the PMOS device 350 has a source/drain extension doping between $1 \times 10^{19}$-$1 \times 10^{21}$ atoms/cm$^3$ and ideally a doping between $1 \times 10^{19}$-$5 \times 10^{19}$ atoms/cm$^3$ with a channel doping between intrinsic and $4 \times 10^{19}$ atoms/cm$^3$ and ideally between $1 \times 10^{18}$-$1 \times 10^{19}$ atoms/cm$^3$ while the NMOS device has a source/drain extension doping between $1 \times 10^{19}$-$1 \times 10^{21}$ atoms/cm$^3$ and ideally a doping between $1 \times 10^{19}$-$5 \times 10^{19}$ atoms/cm$^3$ with a channel doping between intrinsic and $4 \times 10^{19}$ atoms/cm$^3$ and ideally between $1 \times 10^{18}$-$1 \times 10^{19}$ atoms/cm$^3$ so that the gate electrode 360 for the PMOS device 350 has threshold voltage or work function between 0.9-1.1 eV greater than the threshold voltage or work function of the gate electrode 320 of the n type device 310 when both gate electrodes are fabricated from a material or stack of materials having a stand alone midgap work function between 4.3-4.8 eV and ideally between 4.4-4.5 eV.

Figure 4C:
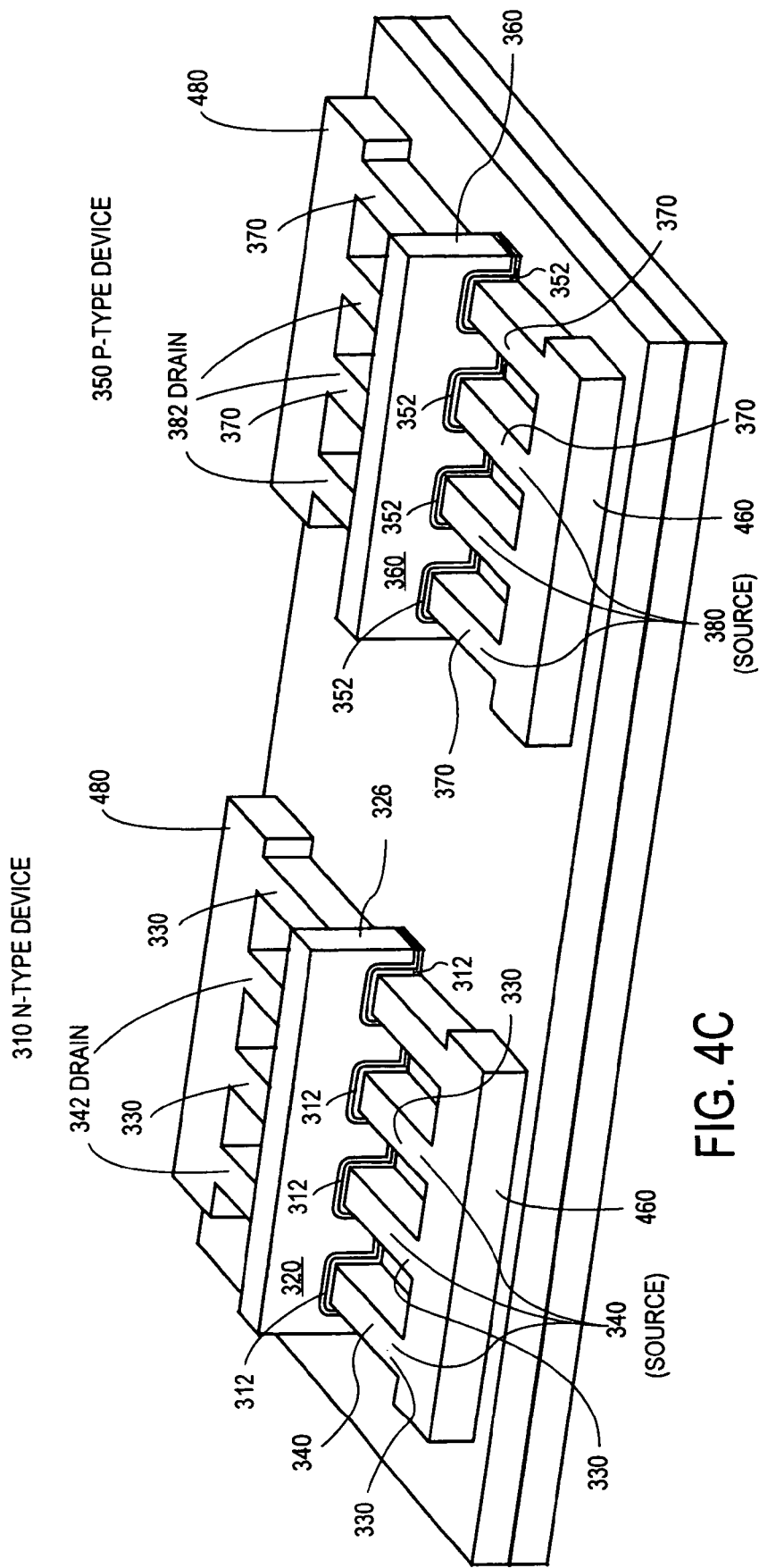
FIG. 4C is an illustration of a CMOS integrated circuit having an n type nonplanar transistor with a metal gate electrode and multiple semiconductor bodies and a p type nonplanar transistor with a metal gate electrode and multiple semiconductor bodies.

As stated above the gate "width" of transistors 310 and 350 are equal to the sum of the three gate width created from semiconductor bodies 330 and 370 respectively. In order to fabricate the transistors with larger gate widths, transistors 310 and 350 can include an additional or multiple semiconductor bodies or fingers 330 and 370 as shown in FIG. 4C. Each semiconductor body 330 and 370 has a gate dielectric layer 312 and 352 formed on its top surface and sidewalls as shown in FIG. 4C. Gate electrode 320 and 360 is formed on and adjacent to each gate dielectric 312 and 352 on each of the semiconductor bodies 330 and 370 as shown in FIG. 4C. Each semiconductor body 330 also includes a source region 340 and drain region 342 formed in each semiconductor body 330 on opposite sides of gate electrode 320 as shown in FIG. 4C. Similarly, each semiconductor body 370 also includes a source region 380 and drain region 382 formed in each semiconductor body 370 on opposite sides of gate electrode 360 as shown in FIG. 4B. In an embodiment of the present invention each semiconductor body 330 is formed with the same width and height (thickness) as the other semiconductor bodies 330. Similarly, in an embodiment of the present invention each semiconductor body 370 is formed with the same width and height (thickness) as the other semiconductor bodies 370. In an embodiment of the present invention each source region 340 and drain region 342 of the semiconductor body 330 are electrically coupled together by the doped semiconductor material used to form semiconductor body 330 to form a source landing pad 460 and a drain landing pad 480 as shown in FIG. 4C. Similarly, in an embodiment of the present invention each source region 380 and drain region 382 of the semiconductor body 370 are electrically coupled together by the doped semiconductor material used to form semiconductor body 370 to form a source landing pad 460 and a drain landing pad 480 as shown in FIG. 4C. The landing pads 460 and 480 are doped to the same conductivity type and levels as the source and drain regions are for each of the transistors 310 and 350. Alternatively, the source region 340 and drain regions 342 can be coupled together by higher levels of metallization (e.g., metal 1, metal 2, metal 3 . . . ) used to electrically interconnect various transistors 310 and 350 together into functional circuits. Similarly, the source region 380 and drain regions 382 can be coupled together by higher levels of metallization (e.g., metal 1, metal 2, metal 3 . . . ) used to electrically interconnect various transistors 310 and 350 together into functional circuits. The gate width of n type nonplanar transistor 310 as shown in FIG. 4C would be equal to the sum of the gate width created by each of the semiconductor bodies 330 and the gate width of p type nonplanar transistor 350 is equal to the sum of the gate widths created by each of the semiconductor bodies 370. In this way, the nonplanar transistors 310 and 350 can be formed with any gate width desired.

Figure 5A:
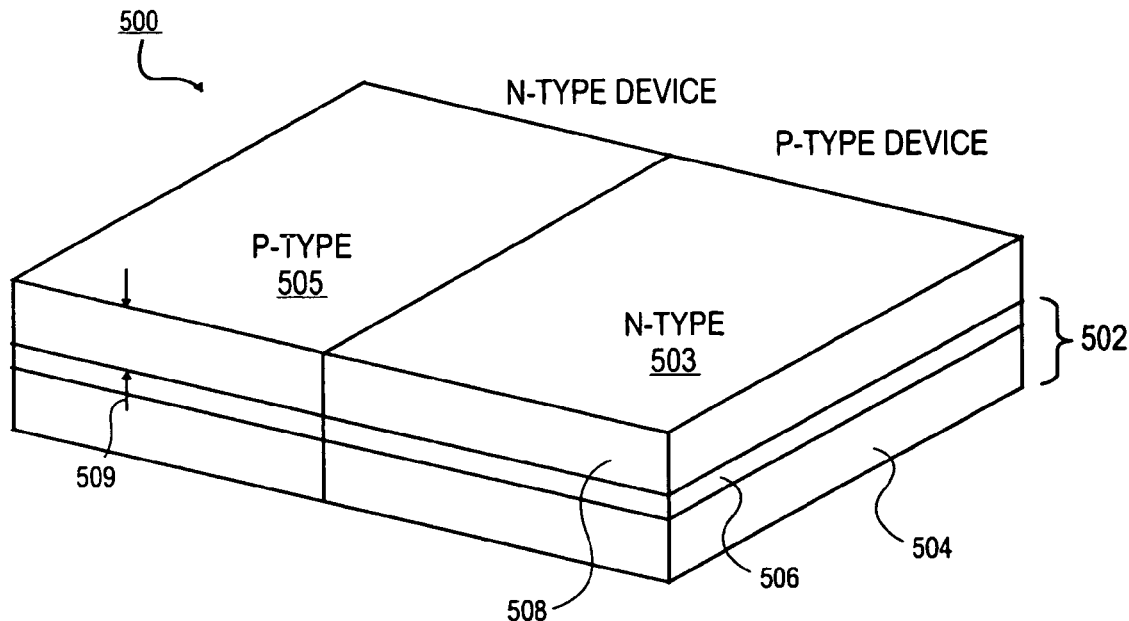
FIGS. 5A-5Z illustrate a method of fabricating a CMOS integrated circuit comprising an n type nonplanar transistor with a metal gate electrode and a p type nonplanar transistor with a metal gate electrode utilizing a replacement gate fabrication process.
Figure 5B:
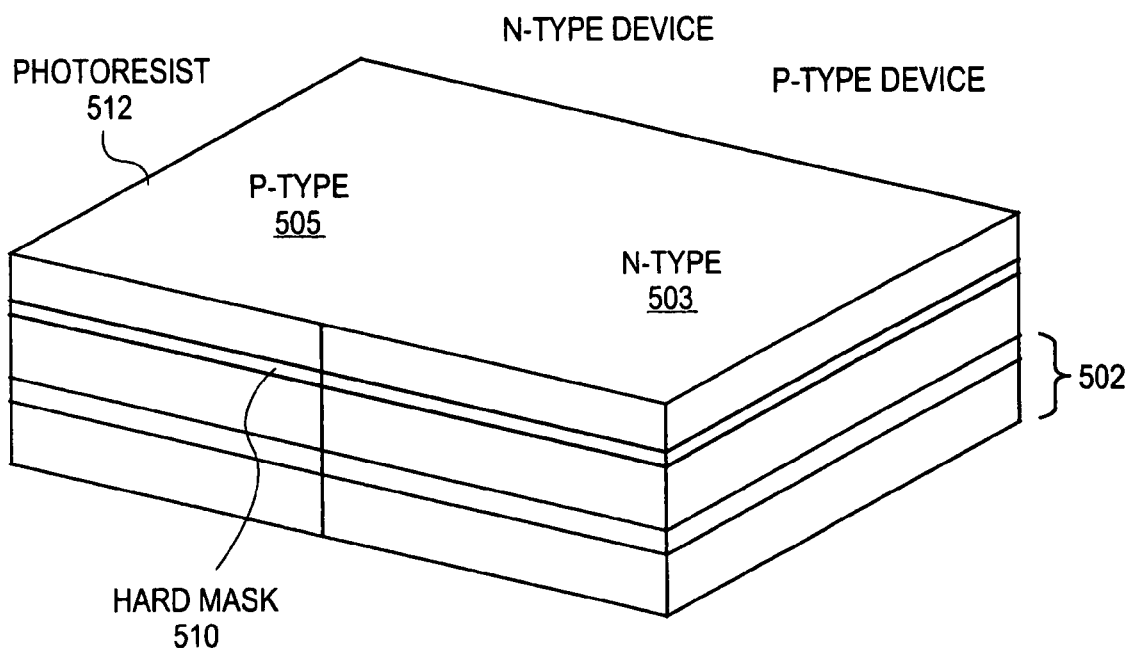
Figure 5C:
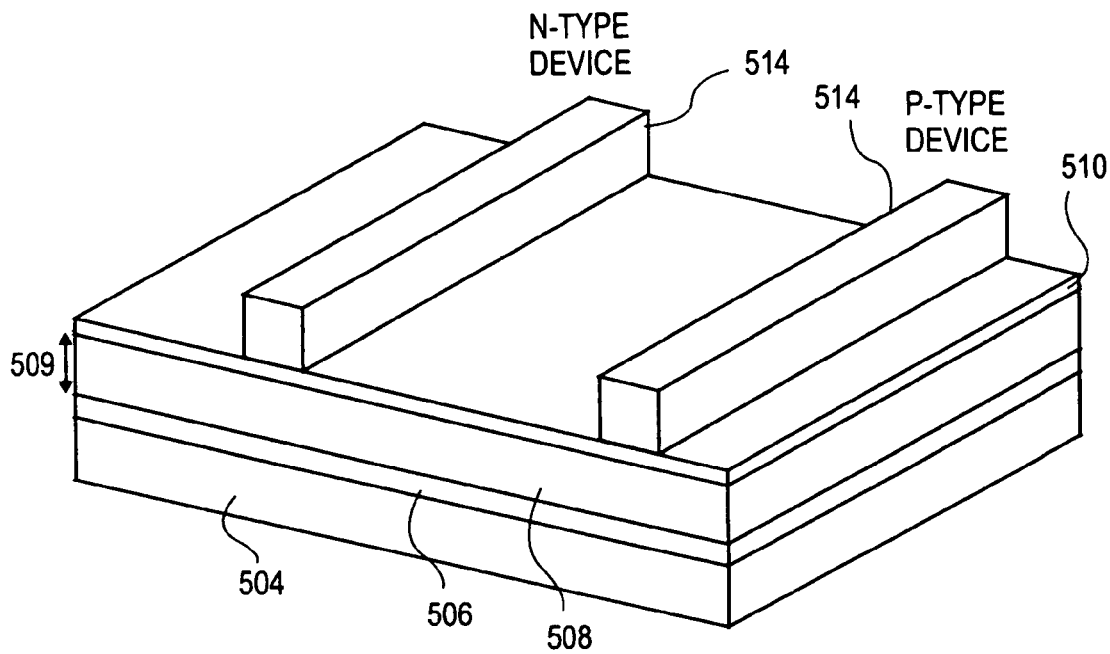
Figure 5D:
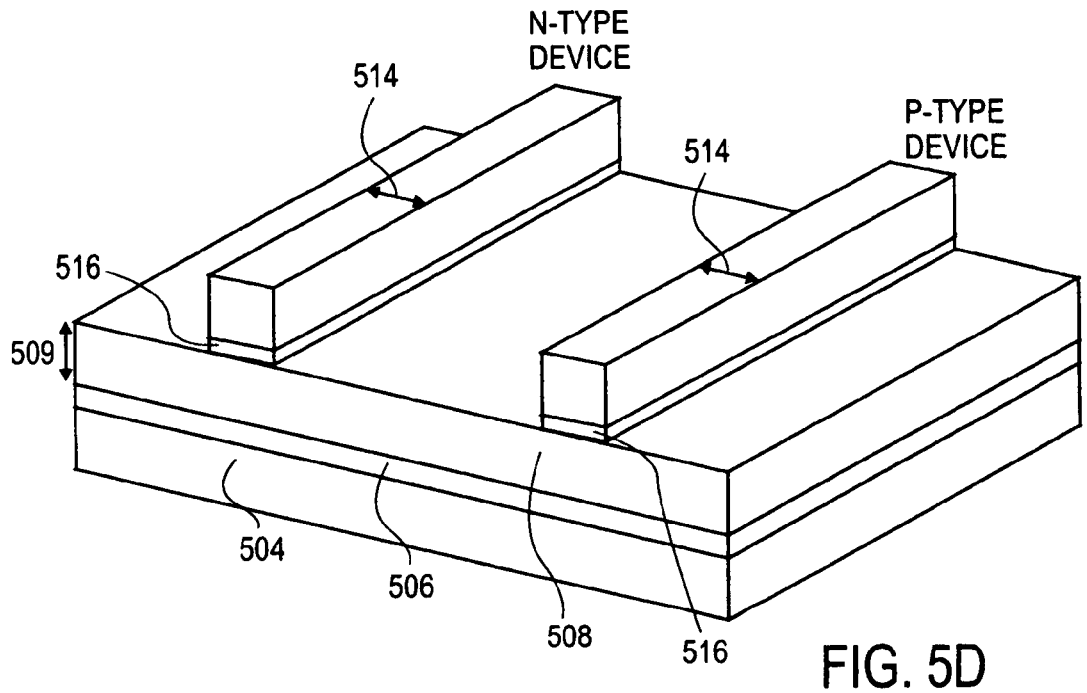
Figure 5E:
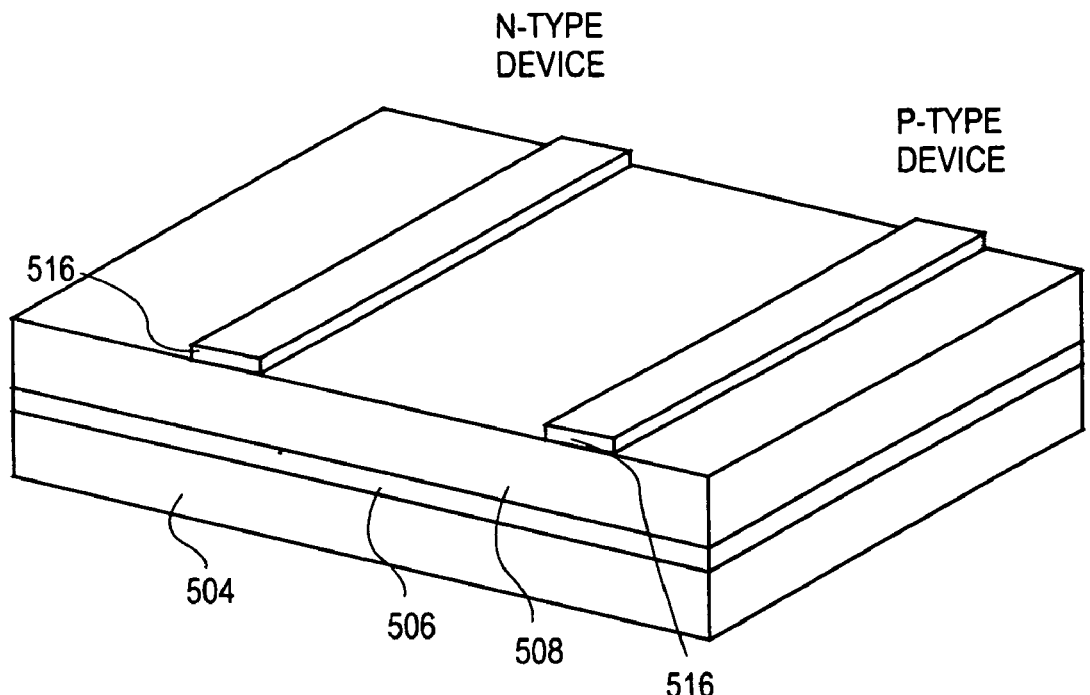
Figure 5F:
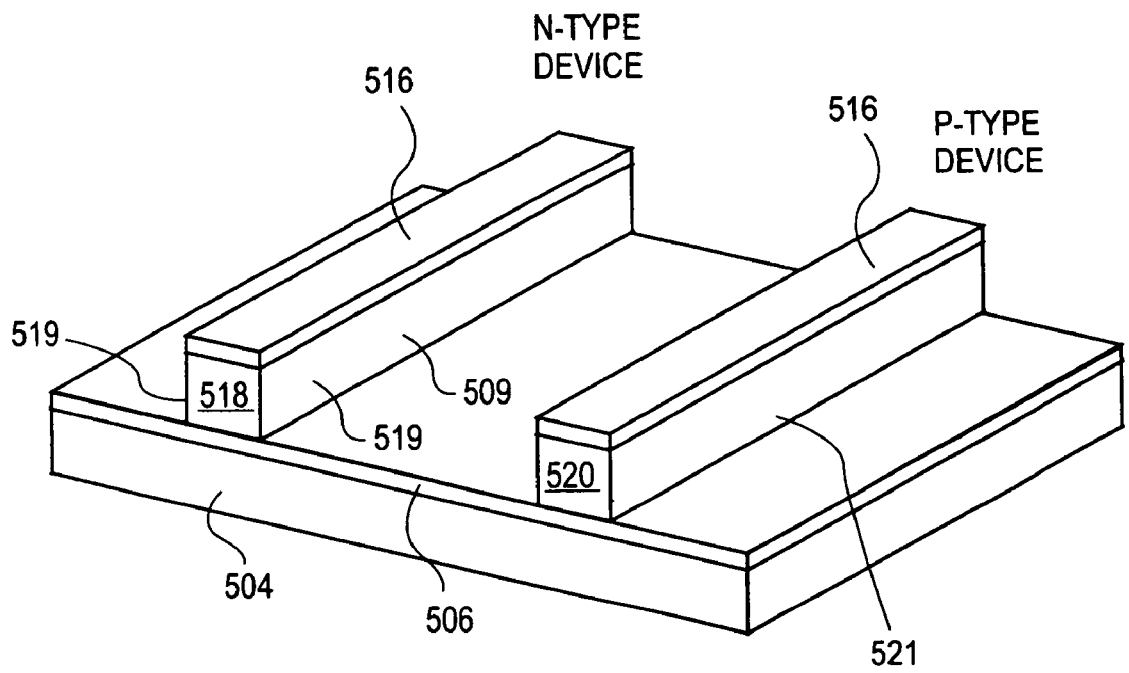
Figure 5G:
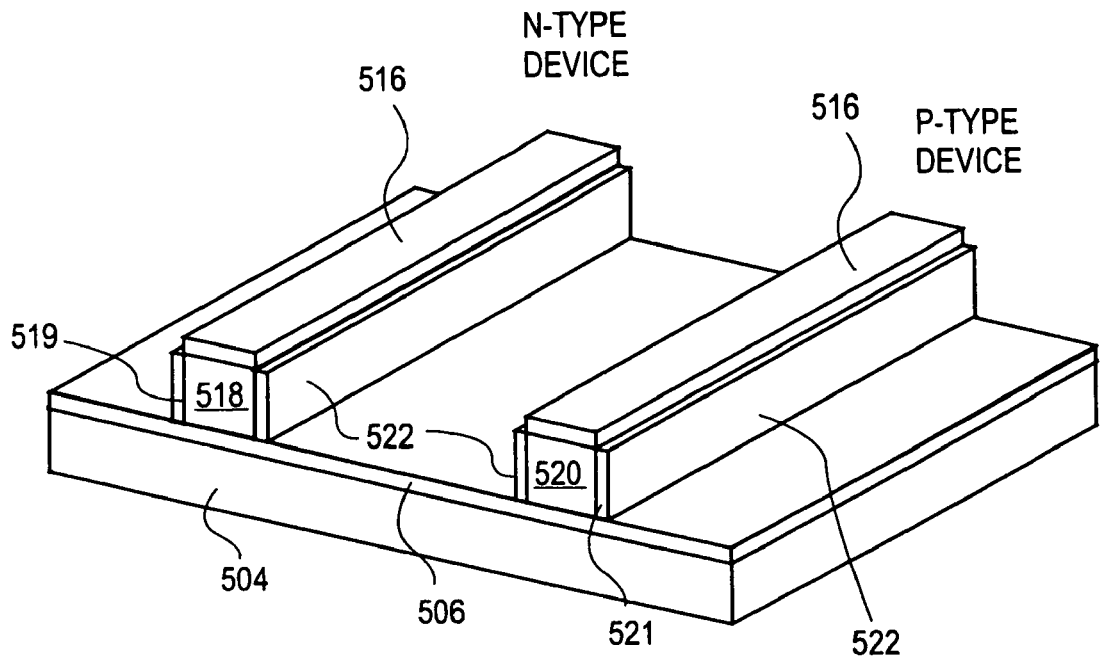
Figure 5H:
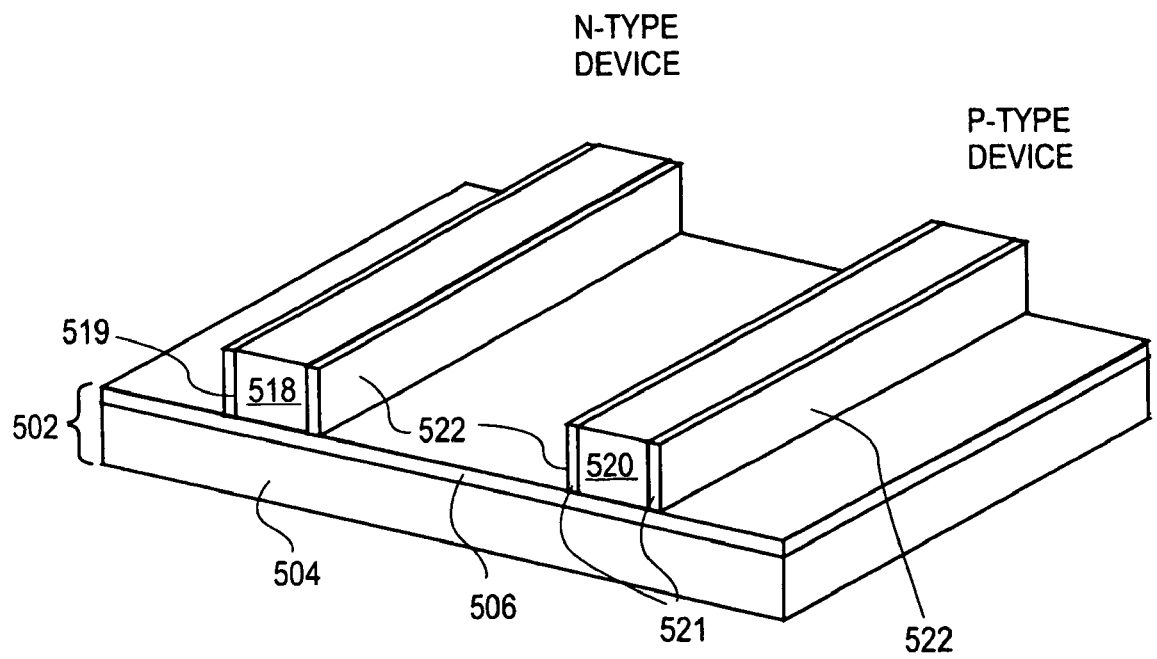
Figure 5I:
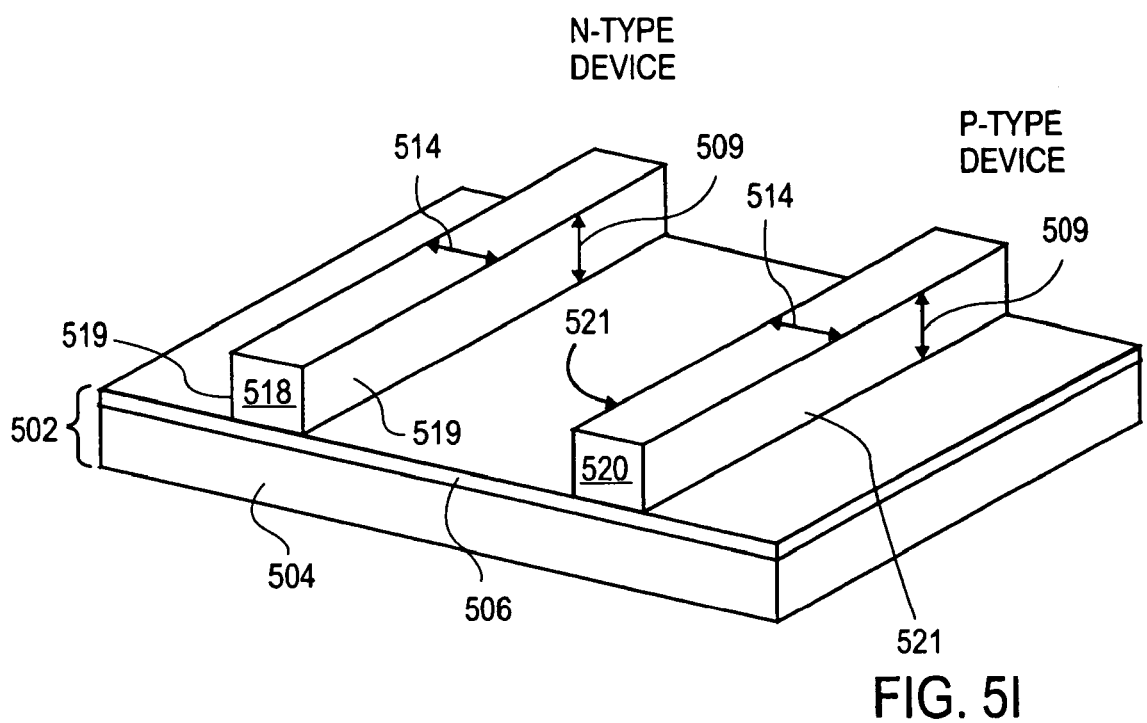
Figure 5L:
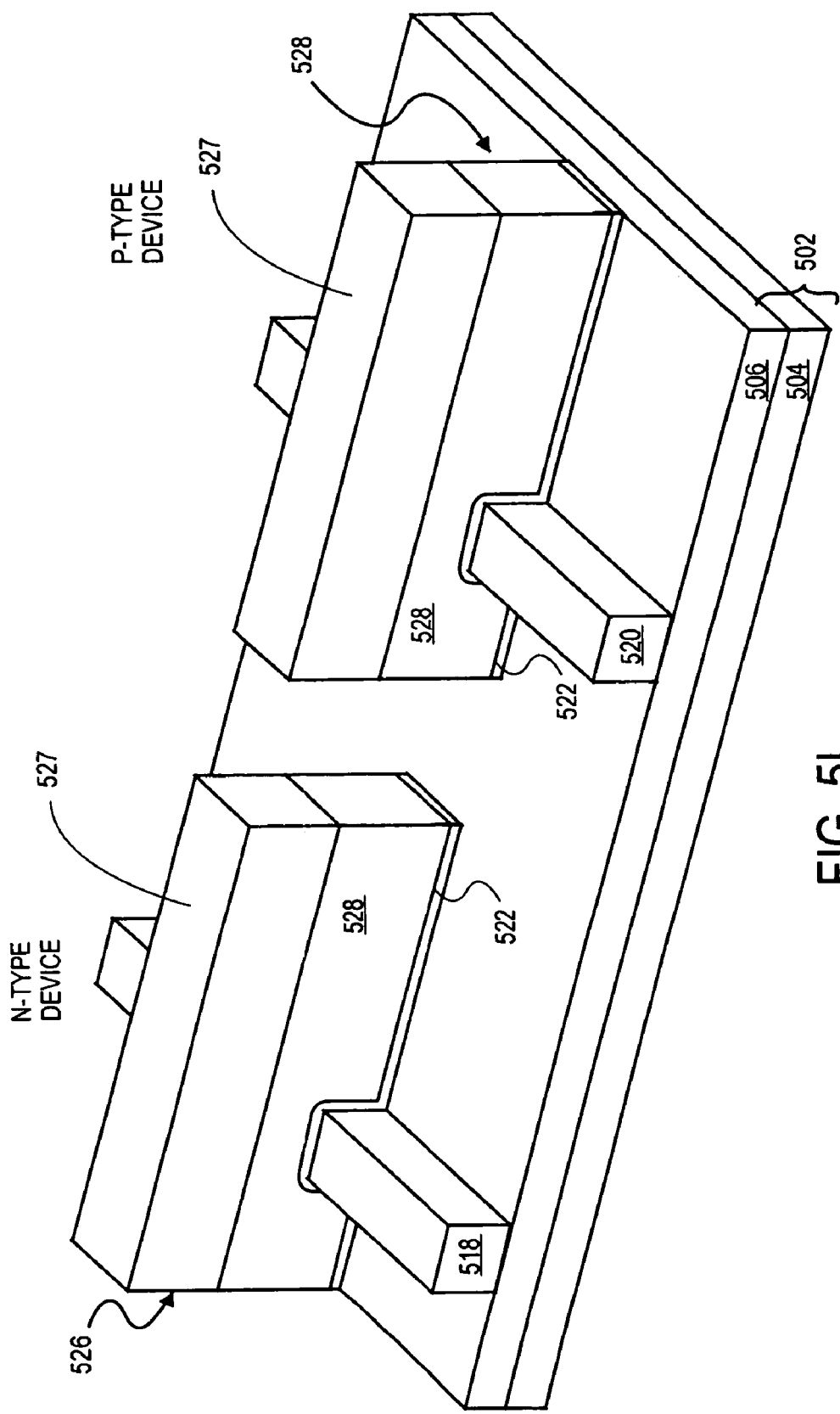
Figure 5M:
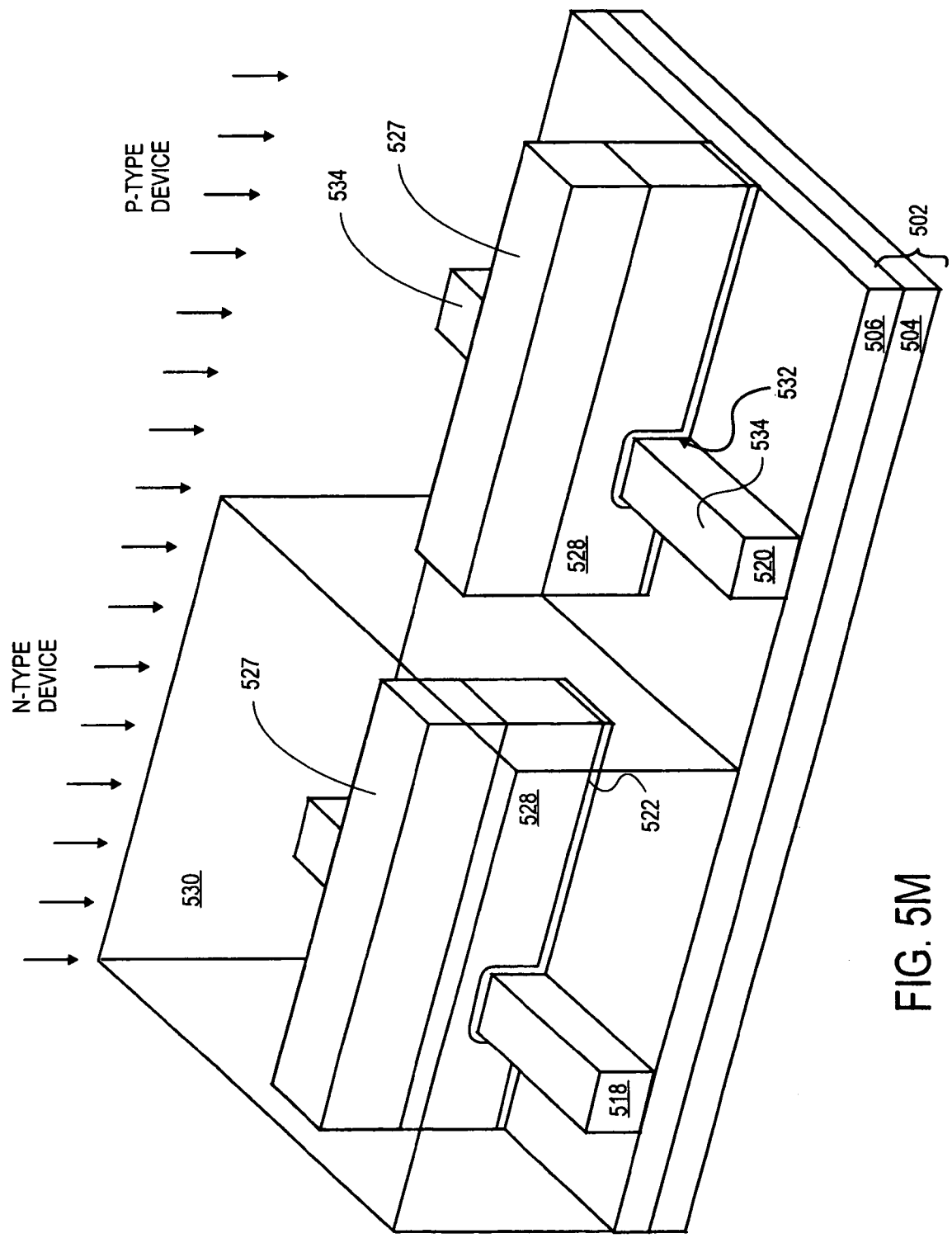
Figure 5N:
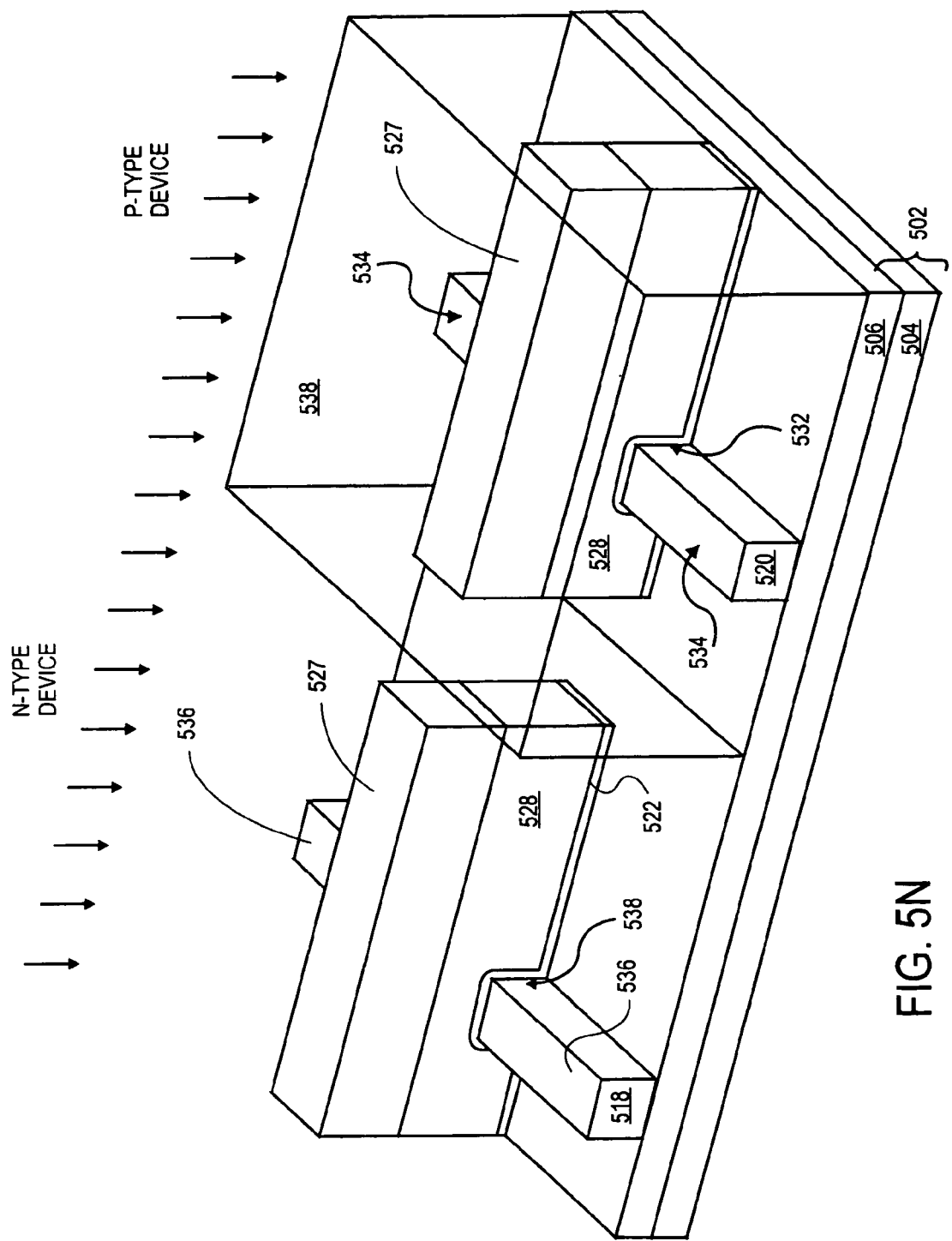
Figure 50:
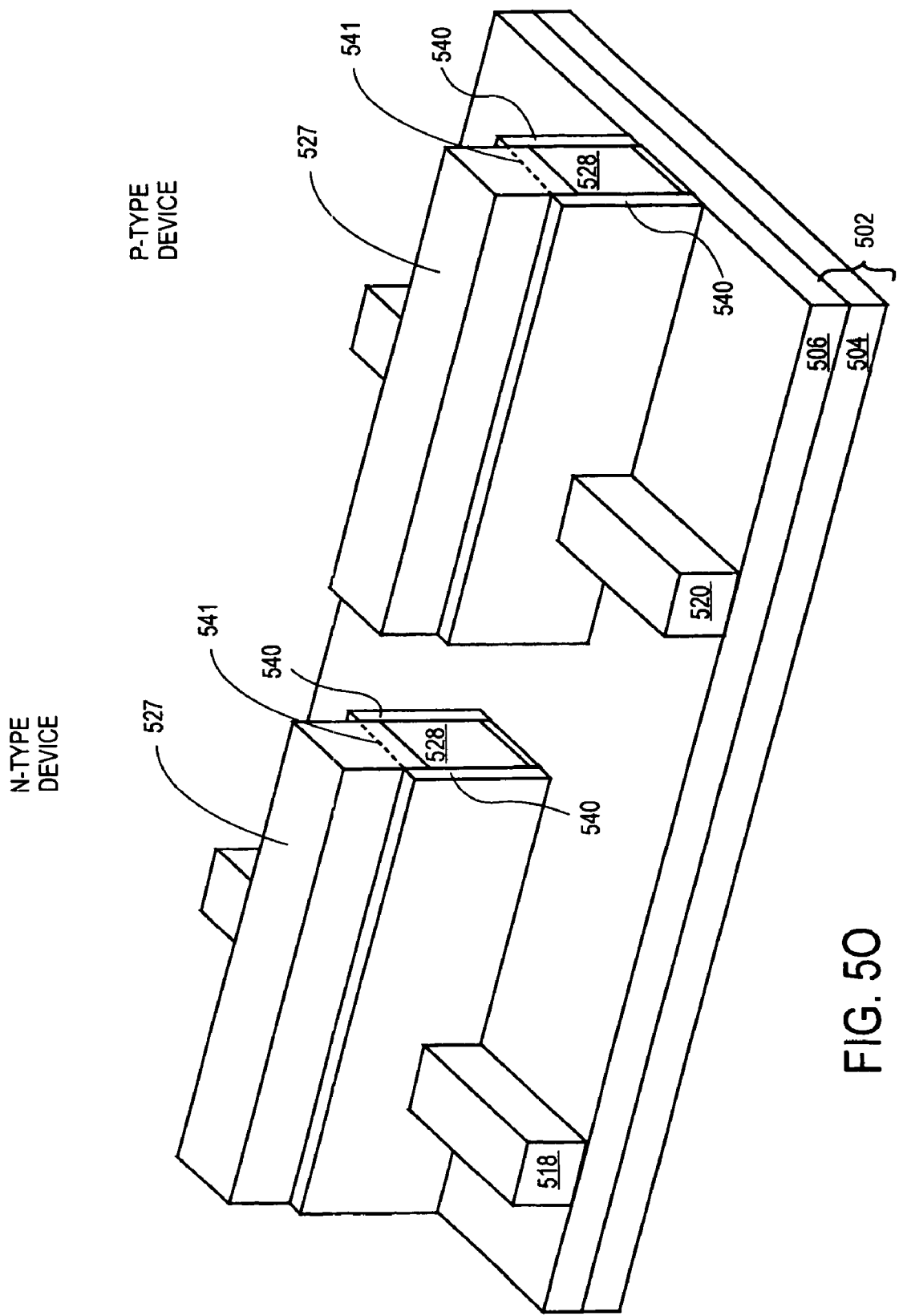
Figure 5P:
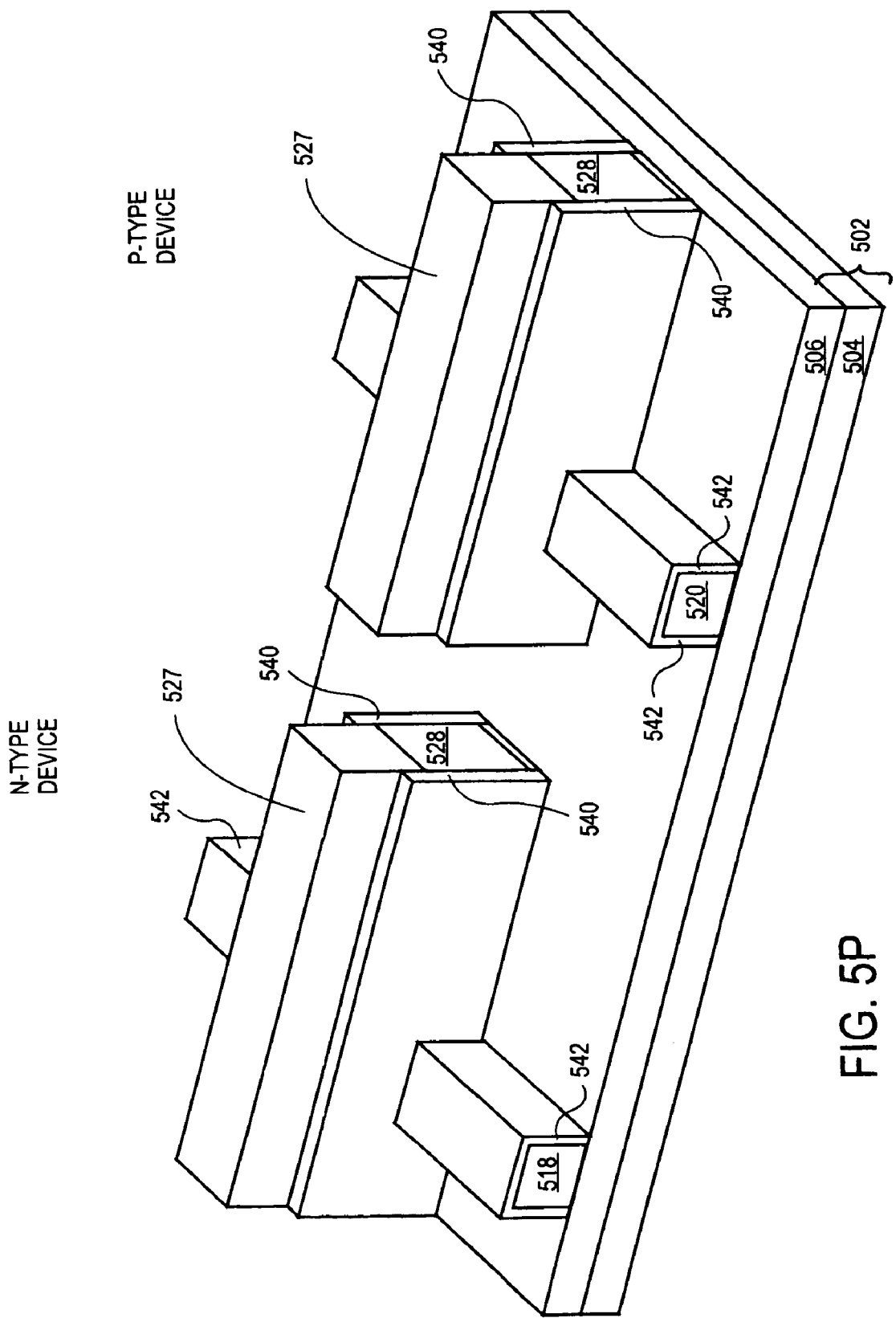
Figure 5Q:
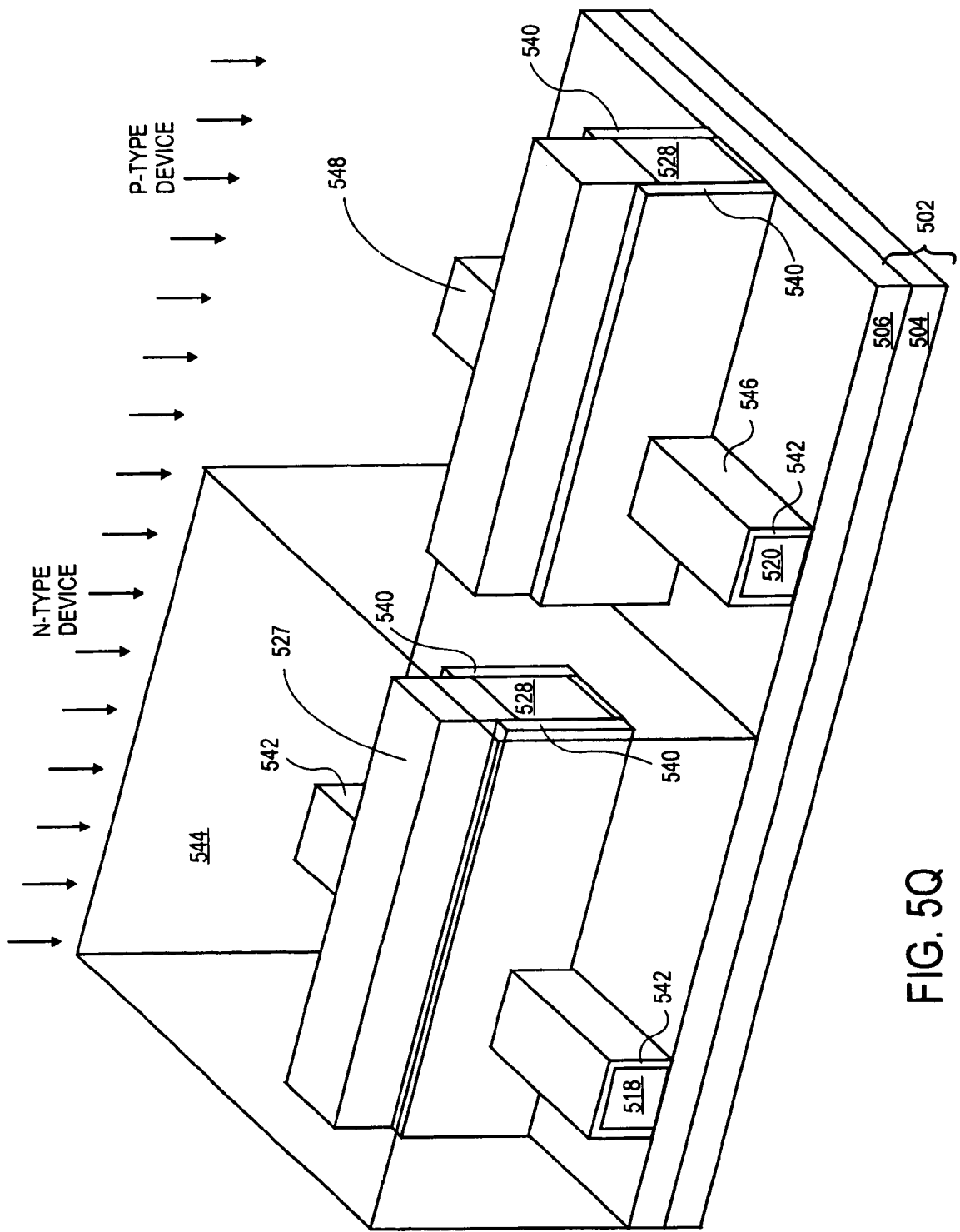
Figure 5R:
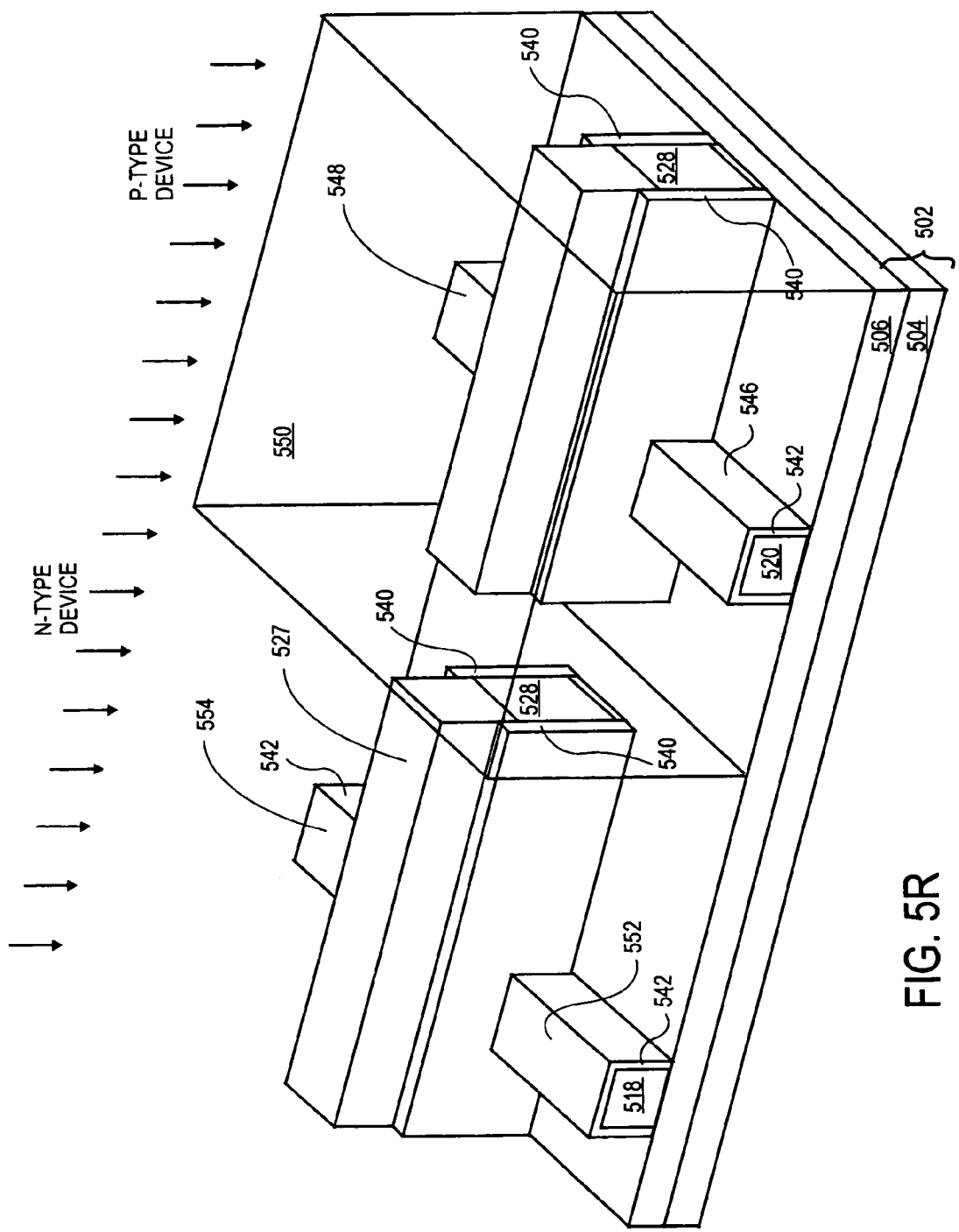
Figure 5S:
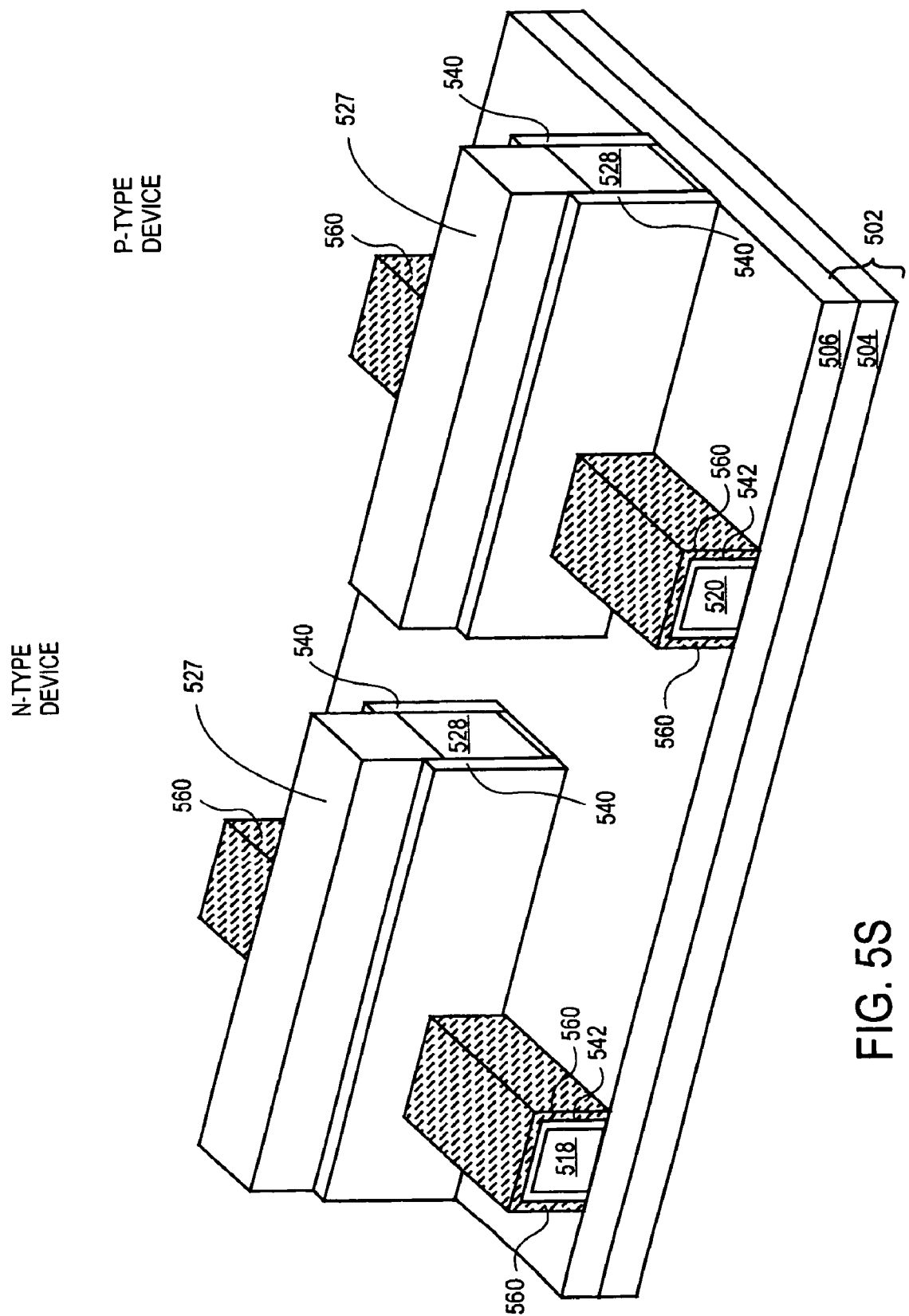
Figure 5T:
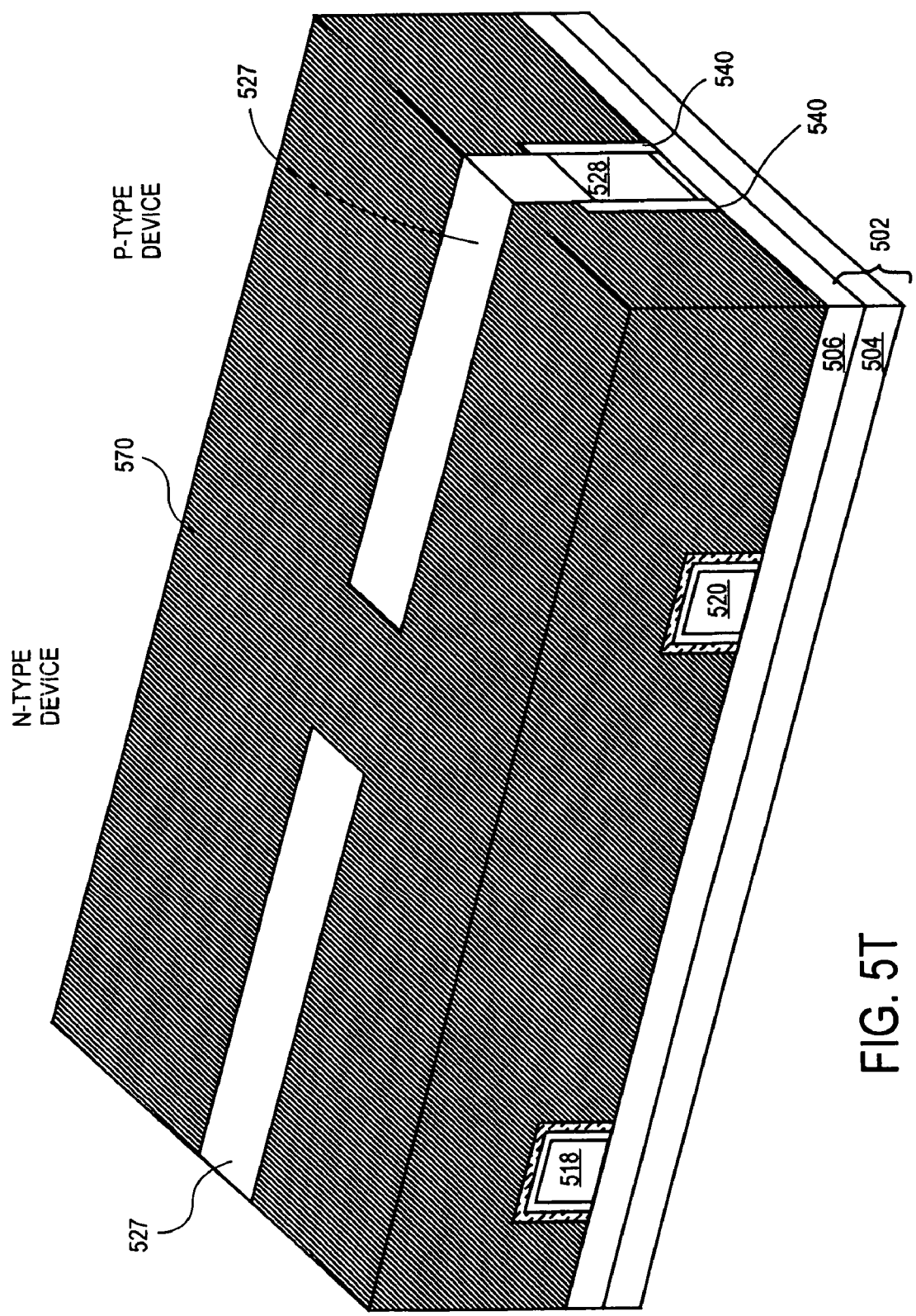
Figure 5U:
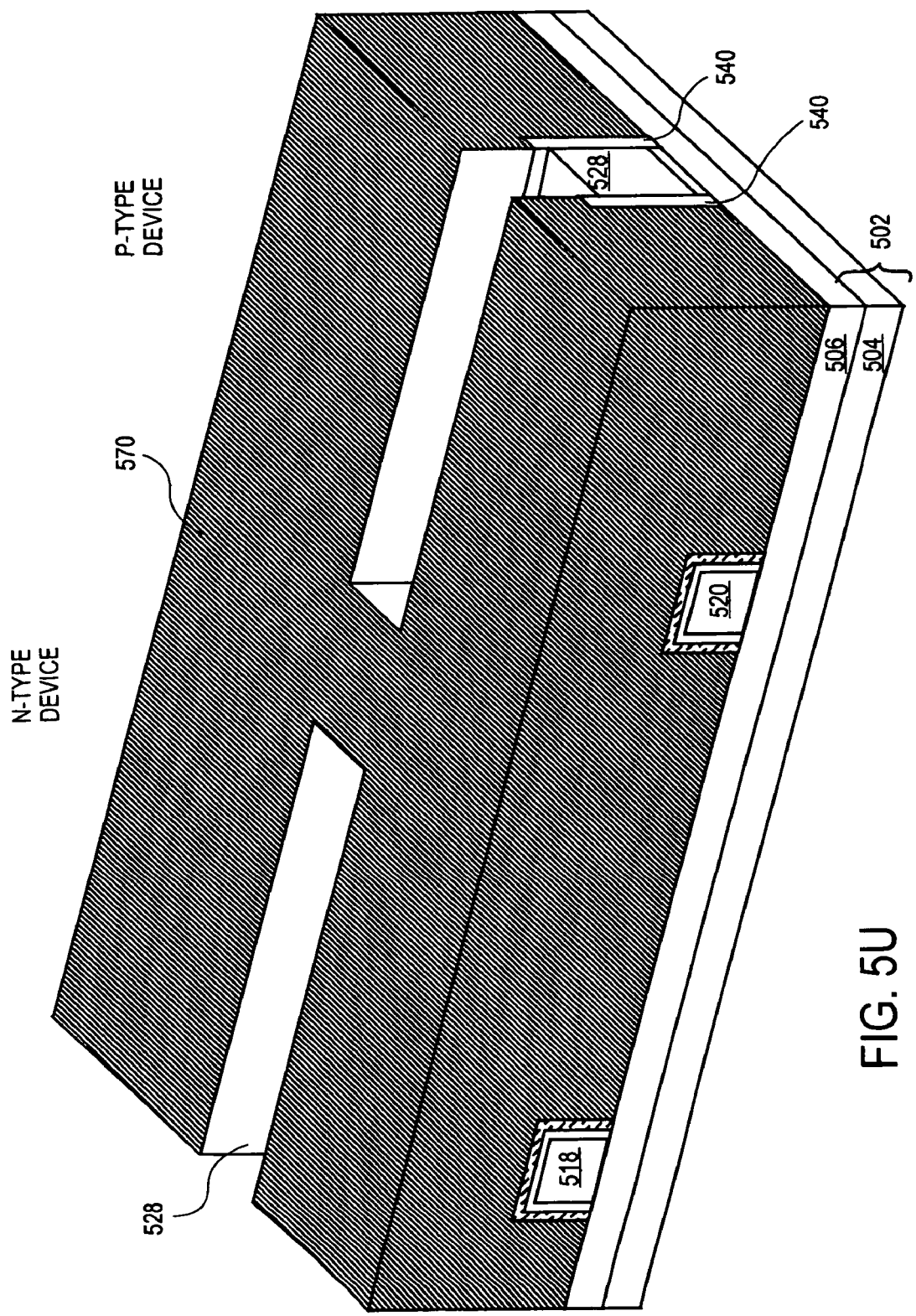
Figure 5V:
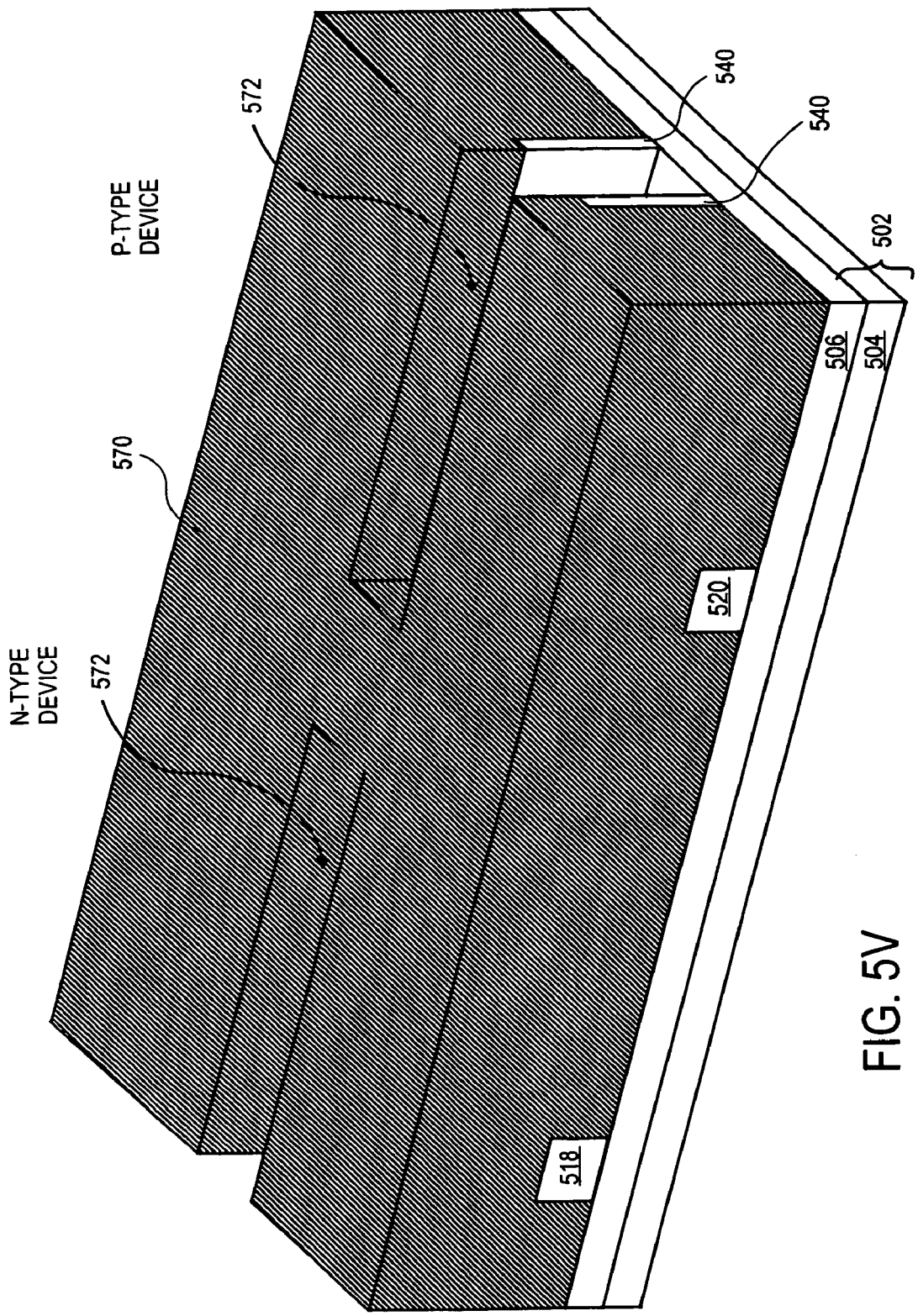
Figure 5W:
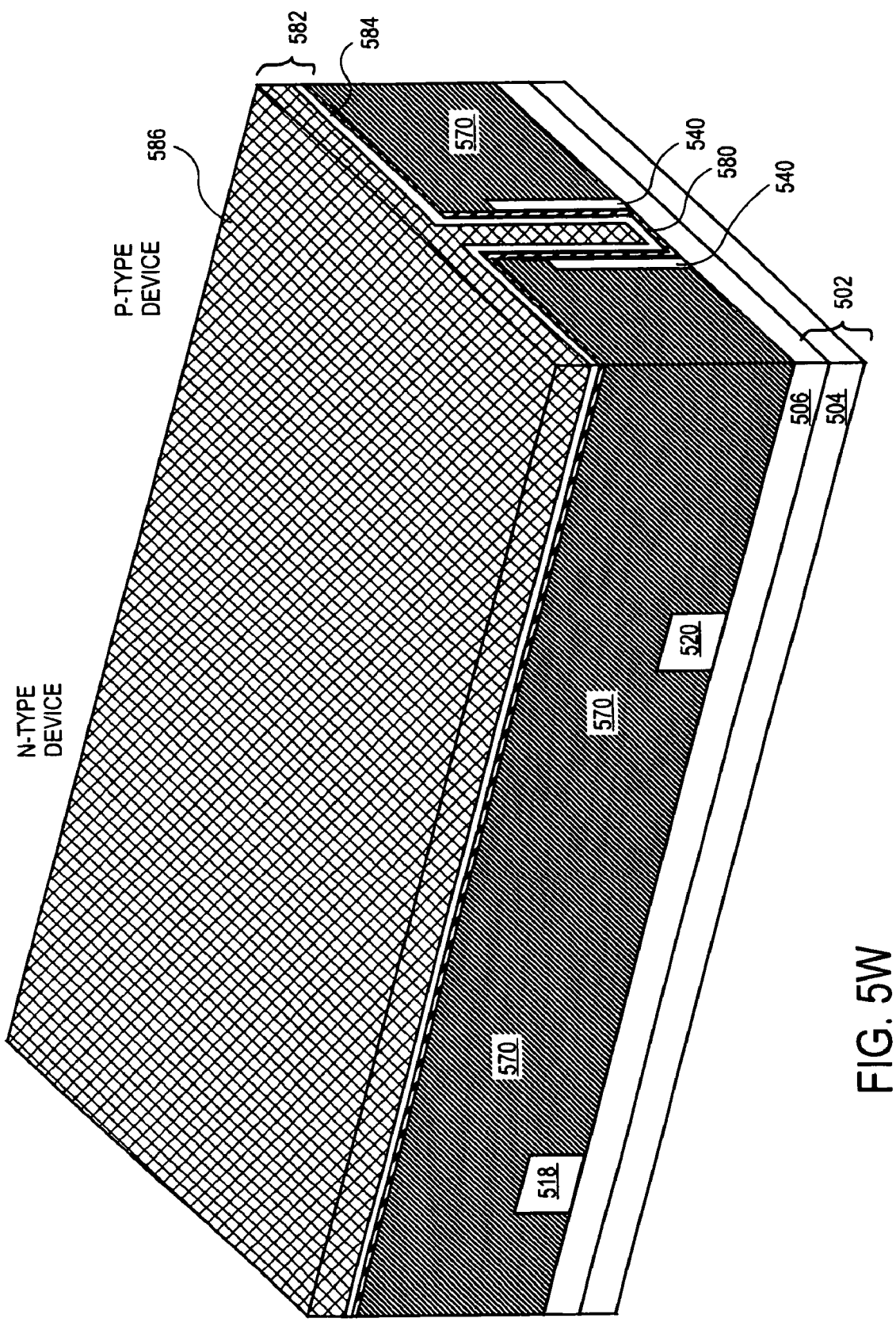
Figure 5X:
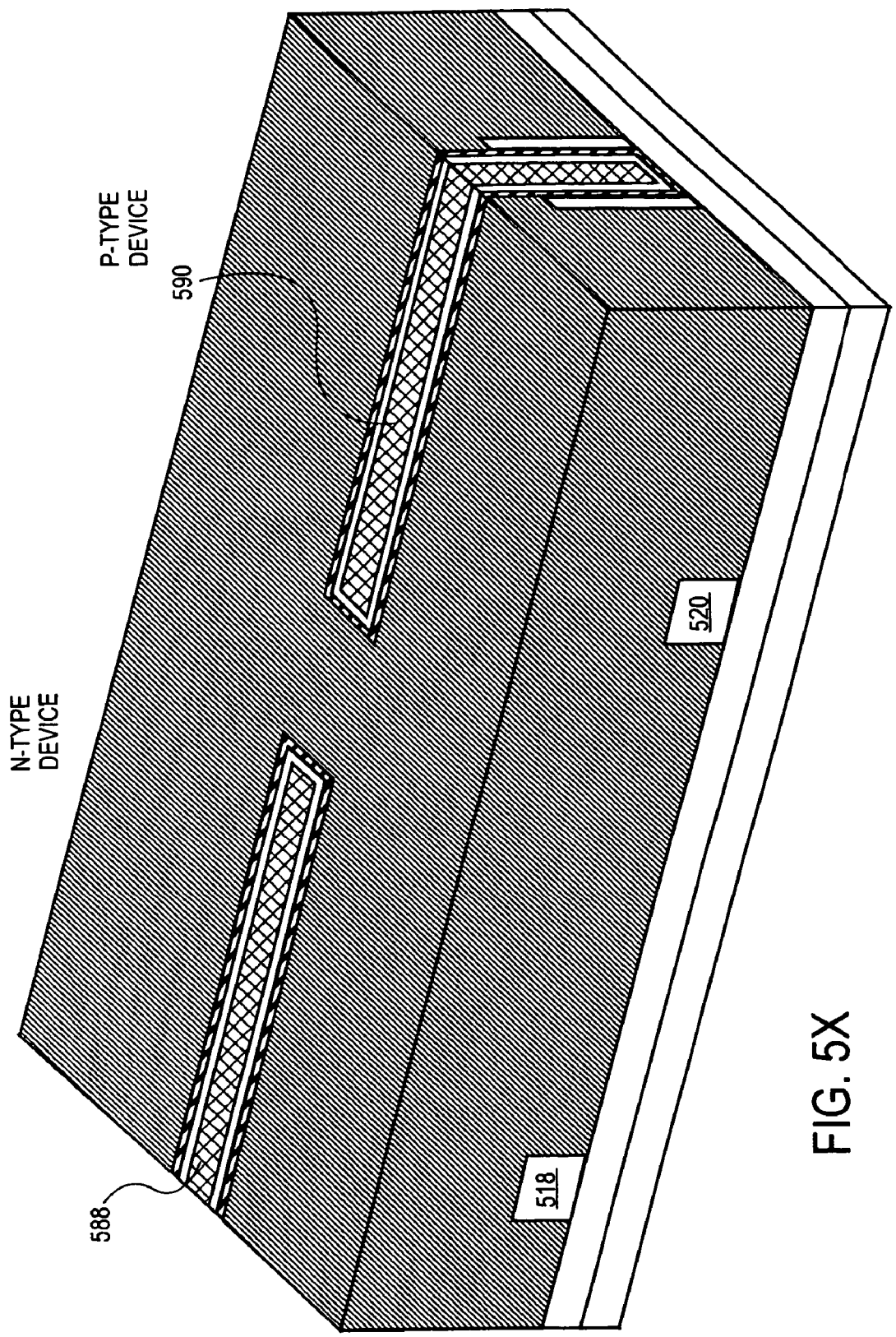
Figure 5Y:
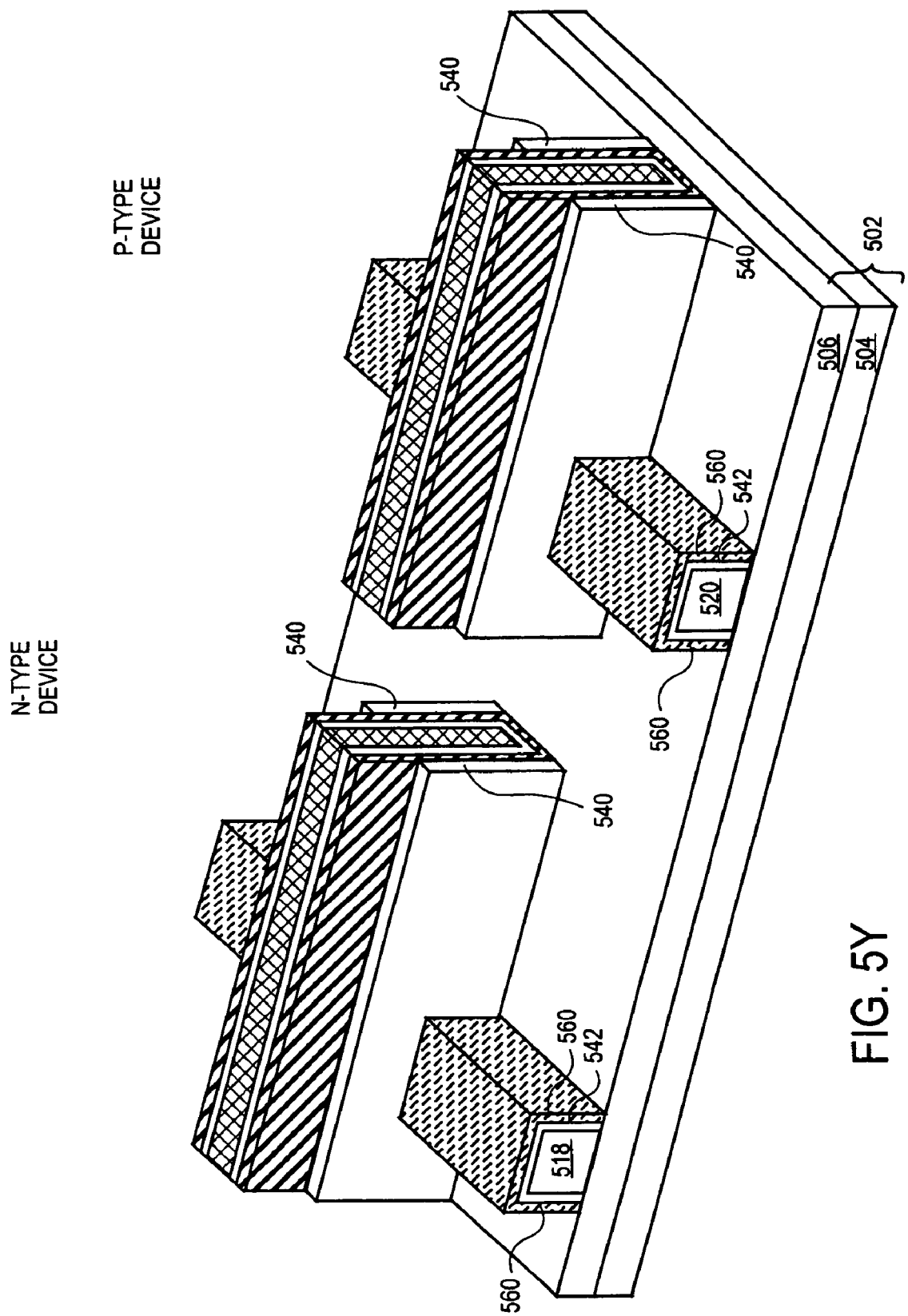
Figure 5Z:
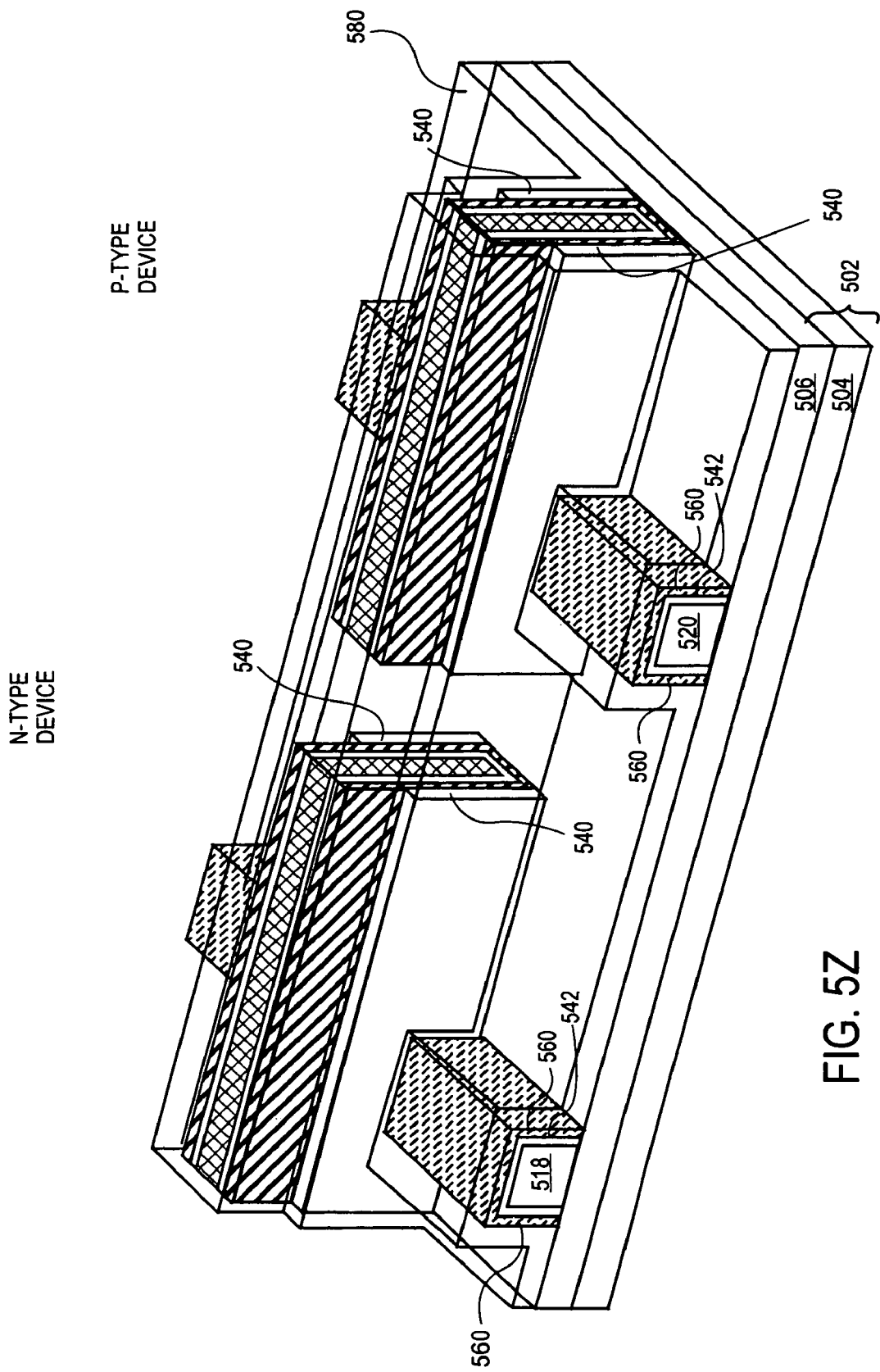

A method of forming a complimentary metal oxide semiconductor integrated circuit having a n type nonplanar transistor with a metal gate electrode and a p type nonplanar transistor with a metal gate electrode utilizing a replacement gate process is illustrated in FIG. 5A-5Z. Although a process for forming a CMOS integrated circuit is illustrated in FIGS. 5A-5Z, it is to be appreciated that one need not necessarily form a CMOS integrated circuit and one can form an integrated circuit comprising only n type nonplanar devices with a metal gate electrodes or p type nonplanar devices with metal gate electrodes, if desired. In such a case, the processing steps to fabricate the unused transistor type are eliminated. The fabrication of a CMOS integrated circuit in accordance with this embodiment of the present invention, begins with a substrate 502. A silicon or semiconductor film 508 is formed on substrate 502 as shown in FIG. 5A. In an embodiment of the present invention, the substrate 502 is an insulating substrate, such as shown in FIG. 5A. In an embodiment of the present invention, insulating substrate 502 includes a lower monocrystalline silicon substrate 504 and a top insulating layer 506, such as silicon dioxide film or a silicon nitride film. Insulating layer 506 isolates semiconductor film 508 from substrate 504 and in an embodiment is formed to a thickness between 200-2000 Å. Insulating layer 506 is sometimes referred to as a "buried oxide" layer. When a silicon or a semiconductor film 508 is formed on insulating substrate 502, a silicon or semiconductor on insulating (SOI) substrate 500 is created. Although a silicon on insulator (SOI) transistor is desired in embodiments of the present invention, the present invention can be also carried out on standard semiconductor substrates, such as but not limited to monocrystalline silicon substrates and gallium arsenide substrates.

Although semiconductor film 508 is ideally a silicon film, in other embodiments it can be other types of semiconductor films, such as but not limited to germanium (Ge), a silicon germanium alloy (Si$_x$Ge$_y$), III-V compounds such as gallium arsenide (GaAs), InSb, GaP, GaSb, as well as carbon nanotubes. In an embodiment of the present invention, semiconductor film 508 is an intrinsic (i.e., undoped) silicon film. In an embodiment of the present invention, the semiconductor film is a single crystalline film with a <100> or a <110> crystal orientation with respect to the Z axis (i.e., axis perpendicular to the plane of substrate 502). Typically, however, the semiconductor film 508 is doped to a p type conductivity at locations 505 where n type transistors are desired and is doped to a n type conductivity at locations 503 where a p type transistor is desired. Semiconductor film 508 is typically be doped to a p type or n type conductivity with a concentration level of between intrinsic and $4 \times 10^{19}$ atoms/cm$^3$ and ideally between $1 \times 10^{18}$-$1 \times 10^{19}$ atoms/cm$^3$. P type regions 505 and n type regions 503 can be formed in semiconductor film 508 utilizing well known photolithography masking and ion implantation techniques.

In an embodiment of the present invention, semiconductor film 508 has a thickness or height 509 of less than 30 nanometers and ideally less than 20 nanometers. In an embodiment of the present invention, semiconductor film 508 is formed to the thickness approximately equal to the gate "length" desired of the fabricated nonplanar transistor. In an embodiment of the present invention, semiconductor film 508 is formed thicker than desired gate length of the device. In an embodiment of the present invention, semiconductor film 508 is formed to a thickness which will enable the fabricated nonplanar transistor to be operated in a fully depleted manner for its designed gate length (Lg).

Semiconductor film 508 can be formed on insulating substrate 502 in any well-known method. In one method of forming a silicon on insulator substrate, known as the SIMOX technique, oxygen atoms are implanted at a high dose into a single crystalline silicon substrate and then anneal to form the buried oxide 506 within the substrate. The portion of the single crystalline silicon substrate above the buried oxide becomes the silicon film 508. Another technique currently used to form SOI substrates is an epitaxial silicon film transfer technique which is generally referred to as Smart Cut. In this technique a first silicon wafer has a thin oxide grown on its surface that will later serve as the buried oxide 506 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plane created by the hydrogen implant. This results in a SOI structure with a thin silicon layer on top, the buried oxide underneath all on top of the single crystalline silicon substrate. Well-known smoothing techniques, such as HCl smoothing or chemical mechanical polishing (CMP) can be used to smooth the top surface of semiconductor film 508 to its desired thickness.

At this time, if desired, isolation regions (not shown) can be formed into SOI substrate 500 in order to isolate the various transistors to be formed therein from one another. Isolation regions can be formed by etching away portions of the semiconductor film 508 surrounding a nonplanar transistor, by for example well-known photolithographic and etching techniques, and then back filling the etched regions with an insulating film, such as $SiO_2$. Alternatively, isolation regions can be formed prior to forming the n type and/or p type doped regions 503 and 505 respectively.

Next, a hard mask material 510 is formed above semiconductor film 508 as shown in FIG. 5B. Hard mask material 510 is a material which can provide a hard mask for the etching of thin film 510. A hard mask material is a material which can retain its profile during the etching of semiconductor film 508. Hard mask material 510 is a material which will not etch or only slightly etch during the etching of semiconductor film 508. In an embodiment of the present invention, the hard mask material is formed of a material such that the etchant used to etch semiconductor film 508 will etch semiconductor film 508 at least 10 times faster than the hard mask material. That is, in an embodiment of the present invention, the semiconductor film 508 and the hard mask material 510 are chosen to provide an etch selectivity of at least 10:1. In an embodiment of the present invention, when thin film 508 is a silicon film, hard mask materials 510 can be a silicon nitride or silicon oxynitride film. Hard mask material 510 is formed to a thickness sufficient to retain its profile during the entire etch of semiconductor film 508 but is not to thick to cause difficulty in its patterning. In an embodiment of the present invention, hard mask material 510 is formed to a thickness between 3 nanometer to 20 nanometers and ideally to a thickness less than 10 nanometers.

Next, as also shown in FIG. 5B, a photoresist film 512 is formed on hard mask layer 510. Next, the photoresist film 512 is patterned into a photoresist mask 514, as shown in FIG. 5C. Photoresist mask 514 contains a feature pattern to be transferred into thin film 508. Photoresist film can be formed into a photoresist mask 514 by masking, exposing, and developing the photoresist film 512 into a photoresist mask 514 having a desired pattern for the thin film 508 to be patterned. Photoresist mask 212 is typically formed of an organic compound. Photoresist mask 514 is formed to a thickness sufficient to retain its profile while patterning hard mask film 510, but yet is not formed too thick to prevent its lithographic patterning into the smallest dimension (i.e., critical dimension) possible with the photolithography system and process used.

Next, as shown in FIG. 5D, hard mask material 510 is etched in alignment with photoresist mask 514 to form a hard mask 516. Photoresist mask 514 prevents the underlying portion of hard mask material 510 from becoming etched. In an embodiment of the present invention, the hard mask 516 is etched with an etchant which can etch the hard mask material but does not etch the underlying semiconductor film 508. The hard mask material is etched with an etchant that has almost perfect selectivity of the underlying thin film 508. That is, in an embodiment of the present invention, hard mask etchant etches the hard mask material at least 10 times faster than the underlying semiconductor film 508 (i.e., etchant has an hard mask to thin film selectivity of at least 10:1). When hard mask 510 is a silicon nitride or silicon oxynitride film, hard mask material 510 can be etched into a hard mask 516 utilizing a dry etch process, such as reactive ion etching. In an embodiment of the present invention, a silicon nitride or silicon oxynitride hard mask is reactive ion etched over a silicon semiconductor film 508 utilizing a chemistry comprising $CHF_3$ and $O_2$ and Ar.

Next, as shown in FIG. 5E, after hard mask film 510 has been patterned into a hard mask 516, photoresist mask 514 can be removed by well known techniques. For example, photoresist mask 514 can be removed, for example, utilizing a "piranha" clean solution which includes sulfuric acid and hydrogen peroxide. Additionally, residue from the photoresist mask 514 can be removed with an $O_2$ ashing.

Although not required, it is desirable to remove photoresist mask 514 prior to patterning thin film 508 so that polymer film from the photoresist does not form on the sidewall of the patterned semiconductor film 508. That is, it is desirable to first remove the photoresist mask prior to etching the semiconductor thin film to form fins or bodies for the device because dry etching processes can erode the photoresist mask and cause a polymer film to develop on the sidewalls of the semiconductor body which can be hard to remove and which can detrimentally effect device performance.

Next, as shown in FIG. 5F, film 508 is etched in alignment with hard mask 516 to form a semiconductor fin or body 518 having a pair of laterally opposite sidewalls 519 for a n type device and a semiconductor fin or body 520 having a pair of laterally opposite sidewalls 521 for a p type device. Hard mask 516 prevents the underlying portion of film 508 from becoming etched during the etch process. The etch is continued until the underlying 502 substrate is reached. Film 508 is etched with an etchant which etches semiconductor film 508 without significantly etching hard mask 516. In an embodiment of the present invention, film 508 is etched with an etchant which enables film 508 to be etched at least 5 times and ideally 10 times faster than hard mask 516 (i.e., etchant has an film 508 to the hard mask 516 etch selectivity of at least 5:1 and ideally at least 10:1). The semiconductor film 508 can be etched utilizing any suitable processes. In an embodiment of the present invention, film 508 is anisotropically etched so that the patterned bodies 518 and 520 have nearly vertical sidewalls 519and 521, respectively, formed in alignment with the sidewalls of hard mask 516 thereby providing an almost perfect fidelity with hard mask 516. When hard mask 516 is a silicon nitride or silicon oxynitride hard mask, and semiconductor film 508 is a silicon film, silicon film 508 can be etched utilizing a dry etch process, such as a reactive ion etch (RIE) or a plasma etch with a chemistry comprising $Cl_2$ and HBr.

Utilizing a hard mask 516 which does not significantly etch while etching semiconductor film 508 enables the profile in the hard mask to remain during the entire etch of semiconductor film 508 insuring that the pattern in hard mask 516 is perfectly transferred into bodies 418 and 520. Generally, when a photoresist mask is used alone, the etchant can cause a breakdown or erosion of the photoresist mask altering the photoresist mask shape and therefore the shape of the etched feature 518 and 520 transferred into semiconductor film 508. Additionally, by removing the photoresist mask prior to etching film 508, no polymer residue is developed on the sidewalls 518 and 521 of the patterned bodies 518 and 520, respectively, thereby leaving pristine sidewalls 519 and 521.

Next, as shown in FIG. 5G, a protective layer 522 is formed onto the sidewalls 519 and 521 of the semiconductor bodies 518 and 520, respectively. The protective layer 522 is formed of a material and to a thickness sufficient to protect the sidewalls 519 and 521 from the etchant used to remove hard mask 516. As such, the protective layer is formed of a material which will not be significantly etched by the etchant which is used to remove the hard mask 516. In an embodiment of the present invention, the protective layer 522 is formed to a thickness sufficient to protect the sidewalls of the bodies 518 and 520 while removing hard mask 516. In an embodiment of the present invention, the protective layer 522 is formed of a material whereby an etchant can etch the hard mask 516 at least one hundred times faster than the material used to form the sidewall protective layer (i.e., the hard mask etchant has a hard mask 516 to protective layer 522 selectivity of at least 100:1).

In an embodiment of the present invention, when the hard mask 516 is a silicon nitride or silicon oxynitride film the sidewall protective layer 522 is an oxide layer, such as a silicon dioxide layer. In an embodiment of the present invention, the sidewall protective layer 522 is a passivating layer grown on the sidewalls of a crystalline silicon bodies 518 and 520. In an embodiment of the present invention, the protective layer 522 is a silicon dioxide film grown on the sidewalls 519 and 521 of a silicon bodies 518 and 520 utilizing a wet chemical treatment with an aqueous solution comprising hydrogen peroxide or an organic peroxide. In an embodiment of the present invention, a silicon dioxide passivating film 522 is grown on the sidewalls 519 and 521 of a silicon bodies 518 and 520 utilizing between 3-12% (by volume) of unstablized (i.e., no organic stabilizers) hydrogen peroxide and DI water. In an embodiment of the present invention, the hydrogen peroxide solution is heated to a temperature between 35-50° C. and ideally to 40° C. while growing the silicon dioxide film 522. Megasonic energy between 0.75 to 1.25 megahertz can be applied to the chemical solution while the wafer is immersed in a chemical bath to grow the film. The megasonic energy helps release the O diradical from the hydrogen peroxide. In an embodiment of the present invention, a thin protective layer between about 5-7Å or about two monolayer of silicon dioxide is formed on the sidewalls 519 and 521. The advantage of the chemical solution described above, is that such a process grows silicon dioxide film in a self limiting manner. That is, the chemical treatment described above grows a silicon dioxide film to approximately two monolayers and then the growth stops thereby providing a very thin film of uniform thickness. In this way, the thickness of the film is not tine dependent providing a manufacturable and reliable growth method. In an embodiment of the present invention, the substrate is immersed in the hydrogen peroxide solution for at least five minutes. If a slightly thicker (e.g., 3 monolayers) silicon dioxide protective layer is desired the temperature of the solution can be increased. Additionally another advantage of the present chemical process used to grow a silicon dioxide film, is that it is not dopant dependent. That is, the silicon dioxide film grows to the same thickness on the sidewalls no matter how much dopant is included on that portion of the sidewall. Additionally, the aqueous solution provides a growth rate and self limiting thickness which is independent of the crystal plane of the patterned silicon bodies 518 and 520. In this way, a very thin and uniform protective layer 522 can be formed in a reliable and manufacturable manner.

Alternatively, other methods can be used to form the protective layer 522. For example, a plasma or thermal oxide can be grown on sidewalls 519 and 521 of a silicon bodies 518 and 520, respectively. For example, a remote or direct plasma process with an ambient comprising $O_2$ or $O_3$ can be utilized to form a protective layer 522.

Next, hard mask 516 is removed from the top of patterned film 516 as shown in FIG. 5G. Hard mask 516 is removed with an etchant which can etch hard mask 516 without significantly etching sidewall protective layers 522. In an embodiment of the present invention, the hard mask 516 is removed with an etchant which etches the hard mask 516 at least 100 times faster than the sidewalls 522 (i.e., the etchant has a hard mask 516 to protective sidewall layer 522 selectivity of at least 100:1). In an embodiment of the present invention, when the hard mask 516 is a silicon nitride or silicon oxynitride film and the protective layer 522 is a silicon dioxide film, a wet chemistry comprising phosphoric acid and DI water can be used to remove the hard mask 516. In an embodiment of the present invention, a hard mask etchant comprising between 80-90% phosphoric acid (by volume) and DI water, heated to a temperature between 150-170° C. and ideally 160° C. is used. In an embodiment of the present invention, a small amount of (e.g., 100 ppm) of silicon, such as TEOS, is dissolved into the phosphoric acid solution in order to help increase its selectivity between the hard mask 516 and sidewall protective layer. Such an etchant will have an almost perfect selectivity between a silicon nitride hard mask 516 and silicon dioxide 522 protective layer. Such an etchant would typically slightly etch or pit unprotected sidewalls of a silicon bodies 518 and 520, respectively. However, in the present invention, the sidewalls 519 and 521 of the silicon bodies 518 and 520 are protected from pitting or etching by protective sidewall layer 522. Thus, in the present invention, the protective sidewall layers 522 enable the hard mask layer 516 to be removed with an etchant which can etch or pit the patterned bodies 518 and 520.

In an embodiment of the present invention, after removing the hard mask 516 the substrate can be cleaned utilizing a standard SC1 and SC2 cleans. It is desirable to clean the substrate after removal of the hard mask with phosphoric acid because phosphoric acid typically includes many metallic impurities which can affect device performance and reliability.

Next, after removing hard mask 516 the sidewall passivation or protective layer 522 are removed from bodies 518 and 520. In an embodiment of the present invention, the sidewall protective layer 522 is removed with an etchant which etches the sidewall passivation layer 522 without significantly etching the semiconductor bodies 518 and 520. In an embodiment of the present invention, the etch used to remove the sidewall protective layer etches the sidewall protective layer 522 at least 100 times faster than the patterned bodies 518 and 520 (i.e., the etchant has a protective layer 522 to the bodies 520 and 520 selectivity of at least 100:1). In an embodiment of the present invention, when the sidewall protective layer 522 is a silicon dioxide film and the semiconductor bodies 518 and 520 are silicon, the sidewall protection layer 522 can be removed with an aqueous solution comprising HF. In an embodiment of the present invention, a silicon dioxide protective layer is removed from a silicon bodies 518 and 520 utilizing a solution comprising between 0.5-2% and ideally 1% (by volume) HF in the DI water. In an embodiment of the present invention, the HF solution is chilled to approximately 15° C. Such an etchant will provide nearly perfect selectivity between a patterned silicon body and the silicon dioxide sidewall protection layer 522.

After removal of the sidewall protection layer 522, a perfectly patterned semiconductor bodies 518 and 520 have been formed. Because of the sidewall protection layer 522, no etch or pitting has occurred on the sidewalls during the removal of the hard mask 516 leaving pristine sidewalls 519 and 521 nearly identical to their original form after the etch shown in FIG. 5F.

It is to be appreciated that although a single semiconductor body is shown for each device type for simplicity of illustration, it is to be appreciated that, if desired, each device type may contain multiple semiconductor bodies 518 and 520 as illustrated in FIG. 4C. Similarly, although source/drain landing pads are not shown in FIG. 5I, source/drain landing pads can be formed at this time in order to connect together various source regions and to connect together various drain regions of the fabricated transistor.

In an embodiment of the present invention, the semiconductor bodies 518 and 520 have a width 514 which is equal to or greater than the width desired for the gate length (Lg) of the fabricated transistor. In this way, the most stringent photolithography constraints used to fabricate the transistor can be associated with the gate electrode patterning and not the semiconductor body of fin definition. In an embodiment of the present invention, the semiconductor bodies or fins 518 and 520 have a width 514 less than or equal to 30 nanometers and ideally less than or equal to 20 nanometers. In an embodiment of the present invention, the semiconductor bodies or fins 518 and 520 have a width 514 approximately equal to the semiconductor body height 509. In an embodiment of the present invention, the semiconductor bodies 518 and 520 have a width 514 which is between one half the semiconductor body height 509 and two times the semiconductor body height 509. It is to be appreciated that, if desired, semiconductor bodies 518 and 520 need not necessarily be formed to the same width.

Although semiconductor bodies 518 and 520 have been formed utilizing a "subtractive" or a "top down" approach as illustrated in FIGS. 5A-5I, it is to be appreciated that alternatively, they can be formed utilizing an "additive" or "bottom up" approach whereby semiconductor bodies 518 and 520 are selectively grown or deposited in place atop the substrate 502 without requiring a subtractive etch of a blanket deposited film. Examples of such semiconductor bodies include, but are not limited to, Group IV nanowires (e.g. Si, Ge, or Ge encased in Si) and semi-conducting carbon nanotubes. Placement approaches of said structures can involve spin-on of preformed materials or directed growth/assembly into a predisposed pattern in the substrate 502.

After the patterning of a semiconductor film to form the semiconductor bodies 510 and 512 (and source/drain landing pads, if desired) a sacrificial gate dielectric layer 522 and a sacrificial gate electrode 604 are formed over the top surface and sidewalls of the silicon bodies 510 and 512 as shown in FIG. 5J and 5K. In order to form the sacrificial gate dielectric 522 and sacrificial gate electrode 524, first a sacrificial gate dielectric layer 522 is formed over the top surface of the sidewalls of the semiconductor bodies 518 and 520. The sacrificial gate dielectric 522 is ideally formed from a material which will not sufficiently etch during the removal or etching of the sacrificial gate electrode material so that it can protect the underlying semiconductor bodies 518 and 520 when the sacrificial gate electrode is subsequently removed. This is especially important when the sacrificial gate electrode material and semiconductor body are formed from the same material, such as silicon. In an embodiment of the present invention, the sacrificial gate dielectric 522 is an oxide, such as silicon dioxide formed to a thickness between 10-30 Å. If the sacrificial gate dielectric is a grown dielectric it will form only on the exposed surfaces of the semiconductor bodies 518 and 520 and not on the insulating substrate 502. If the sacrificial gate dielectric is a deposited film it will be blanket deposited onto the insulating substrate 502 as well as the semiconductor bodies 518 and 520. It is to be appreciated that, if a replacment gate dielectric process is not desired, the actual gate dielectric as opposed to the sacrificial gate dielectric may be formed at this time.

Next, a sacrificial gate electrode material 524 is blanket deposited over the substrate as shown in FIG. 5K. The sacrificial gate electrode material is formed over the sacrificial gate dielectric layer formed on the sidewalls 519 and 521 and top surfaces 515 and 517, respectively, of semiconductor bodies 518 and 520, respectively. In an embodiment of the present invention, the sacrificial gate electrode material is polycrystalline silicon.

In an embodiment of the present invention, the sacrificial gate electrode material 524 is deposited to a thickness or height of at least three times the height of the semiconductor bodies 518 and 520. In an embodiment of the present invention, the sacrificial gate electrode material 524 is formed to a thickness between 200-3000 Å. After deposition, the gate electrode material 524 can be planarized by, for example, chemical mechanical planarization in order to form a gate electrode film with a smooth top surface. Such a smooth top surface will aid in the subsequent patterning of the sacrificial gate electrode.

After deposition and planarization (if desired) of gate electrode material 524, a hard mask material 526, is deposited onto the top surface gate of the sacrificial electrode material 524 as shown in FIG. 5K. The hard mask material 526 is formed of a material which will not be significantly etched or eroded by the etchant subsequently used to pattern the sacrificial gate electrode material into a sacrificial gate electrode. In an embodiment of the present invention, when the sacrificial gate electrode material is polycrystalline silicon, the hard mask material can be, for example, a silicon nitride or silicon oxynitride film. The hard mask material helps improve the anisotropic patterning of the gate electrode material 520. Additionally, the hard mask material is utilized to seal the top surface of the sacrificial gate electrode during subsequent silicon and silicide formation processes. In an embodiment of the present invention, the total thickness of a sacrificial gate electrode material 524 and the hard mask material 526 is approximately equal to the height desired for the subsequently formed gate electrode for the n type and p type devices. Additionally, in an embodiment of the present invention, the hard mask material is formed to a thickness greater than the height of semiconductor bodies 518 and 520 and ideally to a height at least 1.5 times greater than the height of semiconductor bodies 518 and 520. In this way, during the subsequent formation of sidewall spacers, the spacer etch can remove the spacer material from the sidewalls of the semiconductor bodies 518 and 520 without recessing the top surface of the spacers below the bottom of the hard mask thereby insuring that the sacrificial gate electrode material is sealed by the sidewall spacers and the hard mask. In an embodiment of the present invention, when the semiconductor bodies 518 and 520 have a height of approximately 30 nanometers, the hard mask material can be formed to a thickness of approximately 50 nanometers.

Next, as shown in FIG. 5L the hard mask material 526 and the sacrificial gate electrode material 524 are patterned into hard mask 527 and sacrificial gate electrodes 528 for the n type transistor and the p type transistor. Well known photolithography and etching techniques can be used to pattern the gate electrode material 524 into a sacrificial gate electrode 528. In order to pattern hard mask material and the sacrificial gate electrode material 524 into a hard mask and a sacrificial gate electrode 528, a photoresist material can be blanket deposited over the hard mask material 526. Photolithography techniques, such as masking, exposing and developing can then be used to pattern the photoresist material into photoresist mask which defines the location where sacrificial gate electrodes 528 are desired. In an embodiment of the present invention, the photolithography process used to define the gate electrodes, utilizes the minimum or smallest dimension lithography process used to fabricate the nonplanar transistors. Next, the hard mask layer 526 is etched in alignment with the photoresist mask to form the hard mask 527. The hard mask material can be patterned with any technique well known in the industry such as utilizing a reactive ion etching. In an embodiment of the present invention, a silicon nitride or silicon oxynitride hard mask is reactive ion etched over a polysilicon sacrificial gate electrode material 524 utilizing a chemistry comprising $CHF_3$ and $O_2$ and Ar. Next, the sacrificial gate electrode material 524 is etched in alignment with the hard mask 527. The hard mask is formed of a material which does not significantly etch or erode during the sacrificial gate electrode etch, so that the fidelity between a pattern formed in the hard mask is continued into the polysilicon layer 524 during the sacrificial gate electrode etch. It is to be appreciated that the sacrificial gate electrode etch can erode the photoresist mask and cause inaccurate etching of the sacrificial gate electrode material if a hard mask is not utilized. The sacrificial gate electrode etch is continued until the underlying sacrificial gate dielectric 522 is reached. In an embodiment of the present invention, when the hard mask is a silicon nitride or silicon oxynitride film and the sacrificial gate electrode material is polysilicon, a reactive ion etch with a chemistry comprising Cl2 and HBr can be used. The sacrificial gate dielectric layer can be patterned at this time in alignment with the sacrificial gate electrode as shown in FIG. 5L.

Next, the source and drain regions of the p type and n type transistors are formed in the semiconductor bodies 510 and 512 respectively. In an embodiment of the present invention, source and drain regions of the n type and p type transistors include tip or source/drain extensions. In order to fabricate source/drain extensions or tip regions for the p type device a photoresist mask 530 can be formed over the n type transistor region and the p type transistor region left masked or exposed as shown in FIG. 5M. Next, p type dopants are placed within the exposed portions of the semiconductor body 520 which are not covered by gate electrode 528. The semiconductor body 520 is doped in alignment with the outside edges of the sacrificial gate electrode 528 to form p type source/drain extensions 534. In an embodiment of the present invention, the semiconductor body 520 is doped by ion-implantation. In an embodiment of the present invention, the ion-implantation occurs in a vertical direction (i.e., perpendicular to the substrate) as shown in FIG. 5M. The photoresist mask 530 prevents the n type device from being implanted with p type dopants. Hard mask 527 and sacrificial gate electrode 528 acts as a mask to prevent the ion-implantation step from doping the channel region 532 of the p type transistor. The channel region 532 is a portion of the semiconductor body 520 located beneath or surrounded by sacrificial gate electrode 528. It is to be appreciated that other methods, such as solid source diffusion may be used to dope the semiconductor body 520 to form the tip regions 534, if desired. In an embodiment of the present invention, p type source/drain extension regions are formed with doping concentration level between $1\times10^{19}$-$1\times10^{21}$ atoms/cm$^3$ and ideally between $1\times10^{19}$-$5\times10^{19}$ atoms/cm$^3$ when the channel region 532 is between intrinsic and doped to $4\times10^{19}$ atoms/cm$^3$ and ideally between $1\times10^{18}$ atoms/cm$^3$ and $1\times10^{19}$ atoms/cm$^3$ in order to provide a gate electrode for the p type device with a threshold voltage or work function between 4.9 to 5.2 eV, and ideally between 5.0-5.1 eV when the gate electrode is formed from a material or stack of materials having a midgap work function between 4.3 and 4.8 eV and ideally between 4.4-4.5 eV. P type source/drain extension regions can be formed in a silicon semiconductor body 520 by ion implanting boron atoms at a dose around $1\times10^{16}$ atoms/cm$^2$ and an energy between 500 eV and 2 keV and ideally an energy between 600-700 eV. Next, the photoresist mask 530 is removed with well known techniques.

Next, as shown in FIG. 5N, n type source/drain tip or extension regions 536 can be formed in semiconductor body 510 on opposite sides of gate electrode 526. In order to form n type source/drain extensions 536, a photoresist mask 538 can be formed over the region of the substrate containing the p type device and the n type region left unmasked as shown in FIG. 5N. Next, n type dopants, such as arsenic or phosphorous are placed within the exposed portions of semiconductor body 518 to form n type source/drain extensions 536. Photoresist mask 538 prevents the p type device from being implanted with n type dopants. In an embodiment of the present invention, the ion implantation occurs in a vertical direction (i.e., in a direction perpendicular to substrate 502) as shown in FIG. 5N. Sacrificial gate electrode 528 and hard mask 527 prevent the channel region 538 of the n type device from becoming implanted with n type impurities. In an embodiment of the present invention, n type source/drain extension regions 536 are formed with a doping concentration level between $1\times10^{19}$-$1\times10^{21}$ atoms/cm$^3$ and ideally between $1\times10^{19}$-$5\times10^{19}$ atoms/cm$^3$ when the channel region 538 is between intrinsic and doped to $4\times10^{19}$ atoms/cm$^3$ and ideally between $1\times10^{18}$ atoms/cm$^3$ and $1\times10^{19}$ atoms/cm$^3$ in order to provide a gate electrode for the n type device with a threshold voltage or work function between 3.9 to 4.2 eV and ideally between 4.0-4.1 eV when the gate electrode is formed from a material or stack of materials having a midgap work function of, for example, between 4.3 to 4.8 eV and ideally between 4.4-4.5 eV. N type source/drain extensions can be formed by ion implanting arsenic or phosphorous atoms into a silicon semiconductor body 520 at a dose around $1\times10^{16}$ atoms/cm$^3$ and an energy between 500 eV-2 KeV and ideally between 600-800 eV. Next, the photoresist mask 538 is removed with well known techniques.

In embodiments of the present invention, (halo) regions can be formed in the semiconductor bodies 518 and 520 prior to the formation of the source/drain regions or source/drain extension regions. Halo regions are doped regions formed in the channel regions 538 and 532 of the device and are of the conductivity but of slightly higher concentration than the dopant of the channel region of the device. Halo regions can be formed by ion implanting dopants beneath the gate electrodes 526 and 528 utilizing large angled ion implantation techniques.

Next, dielectric sidewalls spacers 540 are formed on the sidewalls of sacrificial gate electrodes 528 as shown in FIG. 5O. Spacers 540 can be formed by blanket depositing a conformal dielectric film, such as but not limited to silicon nitride, silicon oxide, silicon oxynitride or combination thereof over the substrate including the sacrificial gate electrodes 528 and semiconductor bodies 518 and 520. The dielectric film is deposited in conformal manner so that it forms to substantially equal heights on vertical surfaces, such as the sidewalls of the sacrificial gate electrodes 528, as well as on horizontal surfaces, such as in the top of the semiconductor bodies 518 and 520 and on hard mask 527 on the top of the sacrificial gate electrodes 528. In an embodiment of the present invention, the dielectric film is a silicon nitride film formed by a hot wall, low pressure chemical vapor deposition (LPCVD) process. The deposited thickness of the dielectric film determines the width or thickness of the formed spacers. In an embodiment of the present invention, the dielectric film is formed to a thickness between 20-200 Å. Next, the dielectric film is anisotropically etched by, for example, plasma etching or reactive ion etching to form the sidewall spacers 540. The anisotropic etch of the dielectric film removes the dielectric film from horizontal surfaces, such as top of hard mask 527 and leaves dielectric sidewalls spacers 540 adjacent to the vertical surfaces, such as the sidewalls of sacrificial gate electrodes 528. The etch is continued for sufficient period of time to remove the dielectric film from all horizontal surfaces. In an embodiment of the present invention, an over etch is utilized so that the spacer material on the sidewalls of the semiconductor bodies 518 and 520 is removed as shown in FIG. 5O. The result is the formation of sidewall spacers 540 which run along and adjacent to the sidewalls of gate electrodes 528 as shown in FIG. 5O. In an embodiment of the present invention, by making the hard mask 527 at least as thick as the height of the semiconductor bodies 518 and 520, the spacer etch can be continued or over etched long enough to insure that the spacer material clears from the sidewalls of the semiconductor body and still have the top of the spacers 540 above the bottom surface of the hard mask to insure that the sacrificial gate electrode is completely encapsulated by the hard mask 527 in sidewall spacers 540 as shown in FIG. 5O. It is to be appreciated that for illustration purposes only that the spacers 540 are not shown wrapping around the sacrificial gate electrode 520 in the front, so that the height of the spacer material relative to the hard mask and sacrificial gate electrode can be better illustrated. It is to be appreciated that spacer material does wrap around the front of the gate electrodes, as illustrated by dash line 541, so that the sacrificial gate electrode is entirely encapsulated by spacer 540 and hard mask 527.

Next, if desired, a semiconductor film 542 can be formed on the exposed surfaces of semiconductor bodies 518 and 520 (as well as on landing pads, if used) as shown in FIG. 5P. The semiconductor film can be a single crystalline film or a polycrystalline film. In an embodiment of the present invention, the semiconductor film 542 is an epitaxial or (single crystalline) silicon film. In an embodiment of the present invention, the silicon film 542 is formed by a selective deposition process whereby silicon is formed only on exposed regions which contain silicon, such as the exposed top surface and sidewalls of silicon bodies 518 and 520. In a selective deposition process, a silicon film does not form on dielectric areas, such as sidewall spacers 540 or on hard mask 527. Hard mask 527 and spacers 540 entirely encapsulate sacrificial gate electrode 528 so that no silicon is deposited onto the sacrificial gate electrode when the sacrificial gate electrode is formed from polysilicon. In an embodiment of the present invention, a silicon film 542 is formed to a thickness between 50-500 Å. In an embodiment of the present invention, the silicon film is formed to a thickness sufficient to provide enough silicon to be used or consumed during the formation of a silicide film on the source and drain regions. In an embodiment of the present invention, the deposited silicon film 542 is an intrinsic silicon film (i.e., an undoped silicon film). An epitaxial silicon film can be selectively deposited by a chemical vapor deposition process utilizing a chemistry comprising silane and helium at a deposition temperature between 800-850 degrees Celsius. The deposition of a semiconductor film 542 creates raised source and drain regions which improves the parasitics of the transistors.

Next, in an embodiment of the present invention, as shown in FIGS. 5Q and 5R, the deposited silicon film 542 is doped to the conductivity and density desired for the source and drain contact regions. For example, as shown in 5Q, a photoresist mask 544 is formed over the region of the substrate for the n type device and the p type device left unmasked. Next, an ion implantation step is utilized to implant p type conductivity ions, such as boron, into the deposited semiconductor film 542 as well as into the semiconductor body 512 to form heavily doped source/drain regions for the p type device. The ion implantation process can dope the deposited silicon film 542 and the silicon body 520 located underneath to a p type conductivity type with a concentration between $1\times10^2$o to $1\times10^{21}$ atoms/cm$^3$ to form a source contact region 546 and a drain contact region 548. Sidewall spacers 540 offset the heavy source/drain implantation step and define the tip regions as the regions of the doped semiconductor body 520 beneath sidewall spacers 540. The above referenced process form a source region and a drain region which each comprise a tip region 534 and a contact regions 546 and 548. The tip region 534 is a region of the semiconductor body 520 located beneath the sidewall spacers 540. The contact regions 546 and 548 are the region of the semiconductor body and deposited silicon film which are adjacent to the outside edge of the sidewall spacers 540. Photoresist mask 544 can then removed.

Next, as shown in FIG. 5R, a photoresist mask 550 is formed over the p type device region of the substrate and the n type region left unmasked. Next, n type conductivity ions, such as arsenic and phosphorous, are ion implanted in alignment with the outside edges of spacers 540 into the semiconductor film 542 as well as into the semiconductor body 518 located beneath. The ion implantation process dopes the deposited silicon film 542 and the silicon body 518 located underneath to a concentration between $1\times10^{20}$-$1\times10^{21}$ atoms/cm$^3$ to form a source contact regions 552 and a drain contact region 554. The sidewall spacers 540 offset the n type source/drain contact implantation step and define the n type tip regions 536 as a region of the doped semiconductor body 518 located beneath sidewall spacers 540. After forming the source/drain contact regions 552 and 554 the photoresist mask 550 can be removed.

It is to be noted, at this time the implanted dopants which from the tip regions 536 and 534 and the source/drain contacts regions are not yet activated. That is, they have been implanted into the semiconductor material but sit in interstitial sites and have not yet been incorporated into the semiconductor or silicon crystal lattice. A high temperature anneal is required to activate the dopants. In an embodiment of the present invention, the dopants are activated with a rapid thermal anneal process at a temperature between 600-1100° C. for a time between 1-60 seconds in a atmosphere comprising argon and nitrogen. Alternatively, the source/drain dopants can be activated by the anneal used to subsequently form silicide on the transistor as described below.

Next, as shown in FIG. 5S, a refractory metal silicide layer 560 can be formed on the source and drain contact regions of the p type and n type devices. A refractory metal silicide film 560 can be formed with a self-aligned process, such as a silicide process. In a salicide process, a refractory metal film, such titanium, tungsten, nickel, colbalt are blanket deposited over the substrate and silicon films formed on the semiconductor bodies 518 and 520 and gate electrode 528. The substrate is then heated to a suitable temperature to cause a refractory metal film to react with silicon portions of the substrate, such as silicon film 542 formed on semiconductor bodies 518 and 520. Locations where silicon is unavailable to react, such as dielectric spacers 540, hard mask 527 and exposed portions of buried oxide 506 do not react and remain as unreacted refractory metal. Hard mask 527 and spacers 540 prevent silicide from forming on polysilicon sacrificial gate electrode 528. As selective etch, such as a wet etch, can then be utilized to remove the unreacted refractory metal and leave refractory metal silicide 560 on the contact areas. In this way, metal silicide films can be self-aligned to the contact regions of the nonplanar transistors.

Next, as shown in FIG. 5T, a sacrificial dielectric layer 570 is blanket deposited over the substrate 502. The dielectric layer 570 is formed to a thickness sufficient to completely cover the substrate including sacrificial gate electrodes 528 and hard mask 527. A dielectric layer 570 is formed of a material which can be selectively etched with respect to hard mask 527 and sacrificial gate electrode 528. That is, a sacrificial dielectric material 570 is formed of a material whereby the sacrificial gate electrode 528 can be removed without significantly etching away the dielectric layer 570. In an embodiment of the present invention, the sacrificial dielectric layer is silicon dioxide. After blanket depositing the dielectric layer, the dielectric layer is planarized, such as by chemical mechanical planarization, until the top surface of the dielectric film is planar the hard mask 527 on the sacrificial gate electrodes 528 as shown in FIG. 5T.

By planarizing down to the hard mask 527 as opposed to the sacrificial gate electrode 528, more sacrificial dielectric layer 570 is preserved insuring that subsequent polishing steps and other processes do not reveal or expose a semiconductor bodies 518 and 520 lying below. Additionally, polishing to the hard mask as oppose to the sacrificial gate electrode provides a single material (sacrificial dielectric layer 570) to be polished insuring that a uniform polish occurs and prevents dishing which may occur if attempting to polish both sacrificial dielectric layer 570 and hard mask layer 527.

Next, as shown in FIG. 5U, the hard mask 527 is removed. In an embodiment of the present invention, when hard mask 527 is a silicon nitride or silicon oxynitride film and sacrificial dielectric layer 570 is a silicon oxide film, hard mask 527 can be removed utilizing an etchant comprising phosphoric acid at 160 degrees Celsius. Removal of hard mask 527 exposes the top surface of sacrificial gate electrode 528 as illustrated in FIG. 5U.

Next, as shown in FIG. 5V, sacrificial gate electrodes 528 is now removed. After removing sacrificial gate electrodes 528, the sacrificial gate oxides are removed. Removal sacrificial gate electrode 528 and the sacrificial gate dielectric layer exposes the channel region 532 of the semiconductor body 520 of the nonplanar p type device and the channel region 538 of the semiconductor body 518 of the n type device. Additionally, removal of the sacrificial gate electrodes 528 forms openings 572 in dielectric layer 570 where the gate electrodes for the n type and p type device will subsequently be formed. In an embodiment of the present invention, the polysilicon sacrificial gate electrodes 528 are removed utilizing a wet etchant comprising tetramethylammonium hydroxide and water. In an embodiment of the present invention, tetramethylammonium hydroxide comprises between 10-35% of the solution by volume. In an embodiment of the present invention, the tetramethylammonium hydroxide solution is heated to a temperature between 60-95° C. during the etching. In an embodiment of the present invention, sonic energy such as, ultrasonic or megasonic energy, is applied during the etch process. Sonic energy provides agitation to the etchant which enables etch residue from altered sacrificial gate electrode to be removed from opening 572 and allows new etchant to enter into trench 572 to etch the sacrificial gate electrodes 528.

In an embodiment of the present invention, the sacrificial gate electrode etchant is selective to the sacrificial gate dielectric layer (i.e., does not etch or only slightly etches sacrificial gate dielectric) so that the sacrificial gate dielectric 522 acts as an etch stop for the sacrificial gate electrode 528 etch. In this way, the underlying channel regions of semiconductor bodies 518 and 520 are protected from the etchant. A sacrificial gate electrode to sacrificial gate dielectric etch selecting of at least 10:1, is desired.

Next, the sacrificial gate dielectric is removed. In an embodiment of the present invention, the sacrificial gate dielectric is an oxide and can be removed with an etchant comprising aqueous hydrofluoric acid. In an embodiment of the present invention, a 1-2% HF by volume in water etchant is used. Removal of the sacrificial gate dielectric layer with the HF aqueous solution creates a silicon surface with a high concentration of hydride termination (i.e., Si—H) making the surface hydrophobic.

It is to be appreciated that if the gate dielectric layer was formed during step shown FIG. 5J, as opposed to the sacrificial gate dielectric layer, then the gate dielectric layer would not be removed so that it could become part of the device.

Next, as shown in FIGS. 5W, a gate dielectric layer 580 is formed on and around semiconductor body 518 and semiconductor body 520. That is, a gate dielectric layer 580 is formed on the top surface 515 of semiconductor body 518 as well on the laterally opposite sidewalls 519 of semiconductor body 518. Additionally, the gate dielectric layer 580 is formed on the top surface 517 as well on the laterally opposite sidewalls 521 of semiconductor body 520. The gate dielectric layer can be a deposited or grown dielectric layer. In an embodiment of the present invention, the gate dielectric layer 516 is a silicon dioxide dielectric film grown with a dry/wet oxidation process. In an embodiment of the present invention, a silicon oxide film is grown to a thickness of between 5-50 Å. In an embodiment of the present invention, the gate dielectric layer 580 is a deposited dielectric, such as but not limited to a high dielectric constant film, such as a metal oxide dielectric, such as tantalum pentoxide ($Ta_2O_5$) and titanium oxide ($TiO_2$), tantalum oxide, hafnium oxide, zirconium oxide, aluminum oxide, lanthanum oxide, lanthanum aluminum oxide and silicates thereof or other high K dielectrics, such as PZT and BST. A high dielectric constant film can be formed by any well known technique, such as but not limited to chemical vapor deposition (CVD) or atomic layer deposition (ALD). When the dielectric film is a deposited film, it will also form on the exposed surfaces of a buried oxide layer 506 as shown in FIG. 5W.

In an embodiment of the present invention, when the gate dielectric layer is a high k dielectric layer formed by atomic layer deposition (ALD), the surface of the exposed semiconductor bodies are exposed to a surface treatment which makes the hydrophobic surface hydrophilic so that a highly uniformed metal oxide dielectric layer can be deposited. In an embodiment of the present invention, the surface treatment solution comprises hydrogen peroxide. In an embodiment of the present invention, the surface treatment is a solution containing 5-10% by weight unstabilized hydrogen peroxide in ultra-pure deionized water at a temperature between 35 and 45 degrees Celsius and a duration of at least 5 minutes and not exceeding 30 minutes. In one embodiment, the solution is agitated by mega-sonic energy in the frequency range of 750-1250 kHz with power dissipation between 1-5 W/cm2. The resulting surface termination appended to the silicon substrate is comprised mostly of hydroxide substituents (i.e., Si—OH). Such termination enables the inception of the first layer of what will become the high K dielectric layer. Next, the wafer or substrate is moved into an atomic layer deposition (ALD) chamber which is evacuated and heated to a temperature between 350-450° C. and an ALD precursor provided into the chamber and volatilized. In an embodiment of the present invention, the ALD precursor is a metal halide, such as but not limited to $HfCl_4$, $LaCl_3$ and $ZrCl_4$. In an embodiment of the present invention, a short "pulse" of the ALD precursor is provided. Via a substitution reaction, the hydrogen from one of the hydroxide groups associates with a halide ligand (e.g., Cl) from the metal halide ALD precursor, favorably forming gaseous hydrogen halide (e.g. hydrogen chloride). The gaseous by-product (e.g., hydrogen chloride) is removed in vacuo, driving the reaction to continue to favor the by-products. Exposure to the ALD precursor forms a continuous monolayer of a metal halide, for example, a trichlorohafnium-oxo substituent or a trichloro zirconium-oxo substituent on the silicon surface. When a contiguous mono-layer of metal halide has formed on the substrate through the above described association process, the reaction stops. The flow of the ALD precursor is then stopped and a short pulse of water vapor is provided into the chamber. The treatment by water vapor converts all remaining halide groups on the metal halide on the wafer surface to hydroxide groups, providing a bed of hydrophilic substituents reminiscent of the silicon surface post treatment with hydrogen peroxide. *Next, a second monolayer of high k dielectric can be formed in the same manner, by exposing the substrate to a second short pulse of ALD precursor and a second short pulse of wafer vapor. Continual cycles of ALD precursor exposure and wafer vapor exposure can be used until the desired thickness of the high k gate dielectric layer is obtained.

Next, as also shown in FIG. 5W, a gate electrode film 582 is blanket deposited over the gate dielectric layer. The gate electrode film 582 is used to form the gate electrodes for the n type and p type nonplanar transistors. The gate electrode film 520 includes at least a lower metal layer 584 formed directly on or adjacent to the gate dielectric layer 580. Gate electrode film 582 can be a single metal film or can be a composite film formed of multiple layers. In an embodiment of the present invention, the gate electrode film 582 produces a midgap work function between an n type device and a p type device. In an embodiment of the present invention, the gate electrode film 582 produces a stand alone work function between 4.2-4.8 eV and ideally between 4.4-4.5 eV. In an embodiment of the present invention, the gate electrode film 582 comprises a composite stack which includes a lower metal layer 584, such as TiN, formed in direct contact with the gate dielectric layer 580 and an upper metal film 584, such as tungsten or copper. In an embodiment of the present invention the lower metal film is a metal selected from the group consisting of the nitrides and carbides of titanium, hafnium and tantalum, with a stand alone work function that is between 4.2-4.8 eV and ideally between 4.4-4.5 eV. In an embodiment of the present invention, the upper metal film is between 5-30 times thicker than the lower film. In an embodiment of the present invention, the gate electrode has a lower metal film between 25-100 Å thick and an upper metal film between 500-3000 Å thick. In an embodiment of the present invention, the lower metal film is formed thick enough to set the work function for the gate electrode material. The gate electrode film 582 can be formed by any well known method, such as but not limited to chemical vapor deposition (CVD), atomic layer deposition (ALD) and sputtering.

Next, as shown in FIG. 5X, the gate electrode material 582 and gate dielectric layer 580 formed on the top surface of dielectric film 570 are removed from the top surface of dielectric film 570 to form the gate electrode 590 for the p type device and form the gate electrode 588 for the n type device. The gate dielectric layer and gate electrode material 582 formed on top of the sacrificial dielectric layer 570 can be removed by, for example, chemical mechanical polishing or other suitable means.

By removing the sacrificial gate electrode and hard mask p type and n type device simultaneously and by utilizing a single type of material for the p type and n type gate electrodes, fewer processing steps are required to form the p type and n type gate electrodes with a replacement gate process. In this way, the sacrificial dielectric layer 570 is better preserved during processing insuring that the underlying semiconductor bodies 518 and 520 are not affected by erosion of the sacrificial gate dielectric layer. In this way, a robust and manufacturable process is obtained for forming the gate electrodes in a replacement gate process.

Next, dielectric layer 570 may now be removed to expose the p type and n type nonplanar device as shown in FIG. 5Y. When sacrificial dielectric layer 570 is an oxide film, the sacrificial dielectric layer 570 can be removed utilizing an etchant comprising hydrofluoric acid. After removal of the sacrificial dielectric layer 570 the substrate can be cleaned utilizing a well known RCA clean which includes, for example, HF/SC1/SC2.

Next, as shown in FIG. 5Z, a stress film can be blanket deposited over the n type and p type devices. In an embodiment of the present invention, of between 50-300 Å continuous nitride film between 50-300 Å is blanket deposited over the substrate as shown. The nitride film 580 provides a stress to the p type device which provides higher mobility of holes in the p type device.

At this point, the fabrication of an n type and p type nonplanar device having a metal gate electrode and metal oxide dielectric films have been formed. Well known back end processing steps can now be utilized to interconnect the various p type and n type devices together into functional CMOS integrated circuits. The back end of the process includes formation of interlayer dielectric layers and metal interconnects.

Thus, an n type nonplanar transistor with a metal gate electrode and a p type nonplanar transistor with a metal gate electrode and their methods of fabrication CMOS process have been described.

We claim:

1. A method of forming a semiconductor device comprising:

forming a sacrificial gate electrode over and around a semiconductor body having a top surface and a pair of laterally opposite sidewalls, wherein the portion of said semiconductor body surrounded by said sacrificial gate electrode defines a channel region of said semiconductor body;

etching away said sacrificial gate electrode to expose a sacrificial gate dielectric layer;

removing said sacrificial gate dielectric layer with an etchant to expose said channel region of said semiconductor body;

removing said sacrificial gate dielectric layer with an etchant to expose said channel region of said semiconductor body, wherein said etchant makes the surface of said channel region of said semiconductor body into a hydrophobic surface; and converting said hydrophobic surface of said channel region into a hydrophilic surface;

depositing a gate dielectric layer on said top surface and sidewalls of said channel region of said semiconductor body; and depositing a gate electrode material on said gate dielectric layer.

2. The method of claim 1 whereing forming a gate electrode material on said gate dielectric layer comprises:

forming a lower film having a midgap work function and an upper metal film.

3. A method of forming a semiconductor device comprising:

forming a sacrificial gate electrode material on a sacrificial gate dielectric layer over and around a semiconductor body having a top surface and a pair of laterally opposite sidewalls;

forming a hard mask material on said sacrificial gate electrode material;

patterning said sacrificial gate electrode material and said hard mask material into a hard mask and a sacrificial gate electrode wherein the portion of said semiconductor body beneath said sacrificial gate electrode defines a channel region of said semiconductor body;

forming a dielectric layer over and around said sacrificial gate electrode and said hard mask;

planarizing said dielectric layer until said hard mask is exposed and said dielectric layer is substantially planar with the top surface of said hard mask to form a planarized dielectric;

etching away said hard mask to reveal said sacrificial gate electrode;

etching away said sacrificial gate electrode to form an opening in said planarized dielectric layer to expose said sacrificial gate dielectric layer;

removing said sacrificial gate dielectric layer with an etchant to expose said channel region of said semiconductor body, wherein said etchant makes the surface of said channel region of said semiconductor body into a hydrophobic surface;

converting said hydrophobic surface of said channel region into a hydrophilic surface;

depositing a gate dielectric layer on said top surface and sidewalls of said hydrophilic surface of said channel region of said semiconductor body in said opening and on said top surface of said planarized dielectric;

blanket depositing a gate electrode material on said gate dielectric layer in said opening and on said gate dielectric layer on said dielectric layer; and polishing said gate electrode material on said gate dielectric layer until said gate electrode material and said gate dielectric layer are completely removed from the top surface of said dielectric layer to form a gate electrode and a gate dielectric layer.

4. The method of claim 3 wherein said gate electrode material comprises a lower film having a midgap work function and an upper metal film.

5. The method of claim 4 wherein said midgap work function material is selected from the group consisting of the carbides or nitrides of titanium or tantalum.

6. The method of claim 4 wherein said upper metal film metal is selected from the group consisting of copper and tungsten.

7. The method of claim 3 wherein converting said hydrophobic surface of said channel region into said hydrophilic surface comprises exposing said hydrophobic surface to a solution comprising hydrogen peroxide.

8. The method of claim 3 wherein said gate dielectric layer is formed by atomic layer deposition.

9. The method of claim 8 wherein said atomic layer deposition comprises exposing said hydrophilic surface of said semiconductor body to a metal halide.

10. The method of claim 9 wherein said metal halide is hafnium tetrachloride ($HfCl_4$).

* * * * *

UNITED STATES PATENT AND TRADEMARK OFFICE
CERTIFICATE OF CORRECTION

PATENT NO. : 7,531,437 B2 Page 1 of 1
APPLICATION NO. : 11/360269
DATED : May 12, 2009
INVENTOR(S) : Brask et al.

It is certified that error appears in the above-identified patent and that said Letters Patent is hereby corrected as shown below:

In column 27, at line 21, delete "whereing" and insert --wherein--.

Signed and Sealed this

Thirteenth Day of April, 2010

David J. Kappos
*Director of the United States Patent and Trademark Office*